United States Patent
Balakrishnan et al.

[11] Patent Number: 6,135,647
[45] Date of Patent: Oct. 24, 2000

[54] SYSTEM AND METHOD FOR REPRESENTING A SYSTEM LEVEL RTL DESIGN USING HDL INDEPENDENT OBJECTS AND TRANSLATION TO SYNTHESIZABLE RTL CODE

[75] Inventors: Arun Balakrishnan, Santa Clara; Kaushik De, San Jose; Jun Qian, Sunnyvale, all of Calif.

[73] Assignee: LSI Logic Corporation, Milpitas, Calif.

[21] Appl. No.: 08/956,874

[22] Filed: Oct. 23, 1997

[51] Int. Cl.⁷ .................................................. G06F 17/50
[52] U.S. Cl. ........................................................ 395/500.19
[58] Field of Search ............................ 395/500.19, 500.04

[56] References Cited

U.S. PATENT DOCUMENTS

| | | | |
|---|---|---|---|
| 5,487,018 | 1/1996 | Loos et al. ................................. | 364/489 |
| 5,519,627 | 5/1996 | Mahmood et al. ........................ | 364/488 |
| 5,530,841 | 6/1996 | Gregory et al. ...................... | 395/500.04 |
| 5,537,580 | 7/1996 | Giomi et al. .............................. | 395/500 |
| 5,581,781 | 12/1996 | Gregory et al. ...................... | 395/500.19 |
| 5,812,416 | 9/1998 | Gupte et al. ............................. | 364/490 |
| 5,841,663 | 11/1924 | Sharma et al. ........................... | 364/490 |
| 5,867,399 | 2/1999 | Rostoker et al. .................... | 395/500.19 |
| 5,880,971 | 3/1999 | Dangelo et al. ..................... | 395/500.07 |
| 5,953,235 | 9/1999 | Gregory et al. ..................... | 395/500.19 |

*Primary Examiner*—Paul R. Lintz
*Assistant Examiner*—Leigh Marie Garbowski

[57] ABSTRACT

A system and method for representing a system level RTL hardware design using an HDL independent RTL representation and translation into synthesizable RTL code. The present invention creates an object-oriented library which can be used to implement RTL hardware designs in terms of HDL independent objects. Instead of implementing multiple HDL instances of hardware modules, the invention enables software tool programmers to implement one HDL-independent instance of the hardware module. As a result, a programmer can focus his efforts on generating the functionality of the module and can be relieved from the time consuming task of generating the detailed syntax of multiple HDLs. The present invention also maintains synchronization across multiple HDLs so that a software designer can generate HDL code for any supported HDL, e.g., Verilog or VHDL, thus making software maintenance easier.

15 Claims, 22 Drawing Sheets

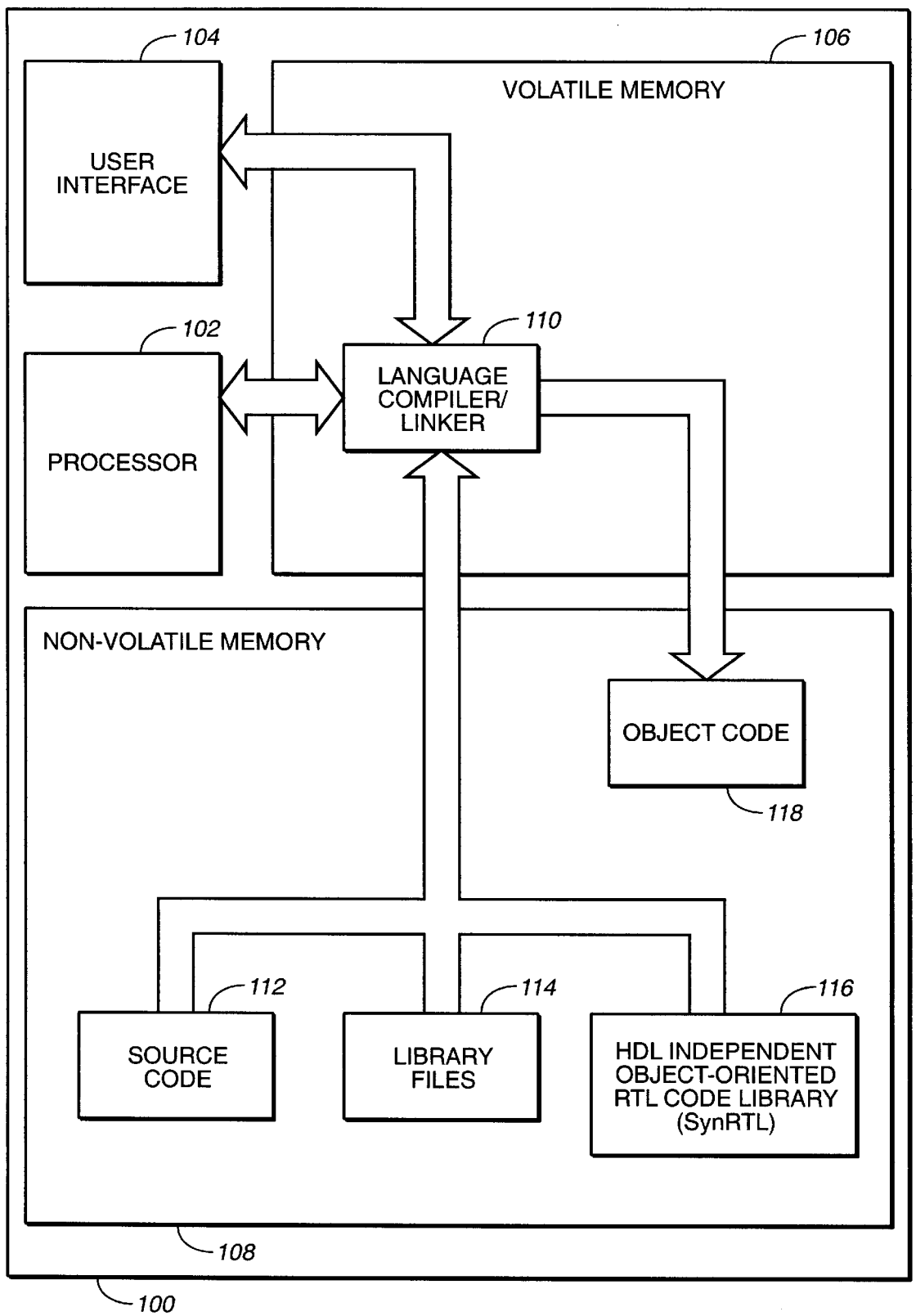
FIG._1

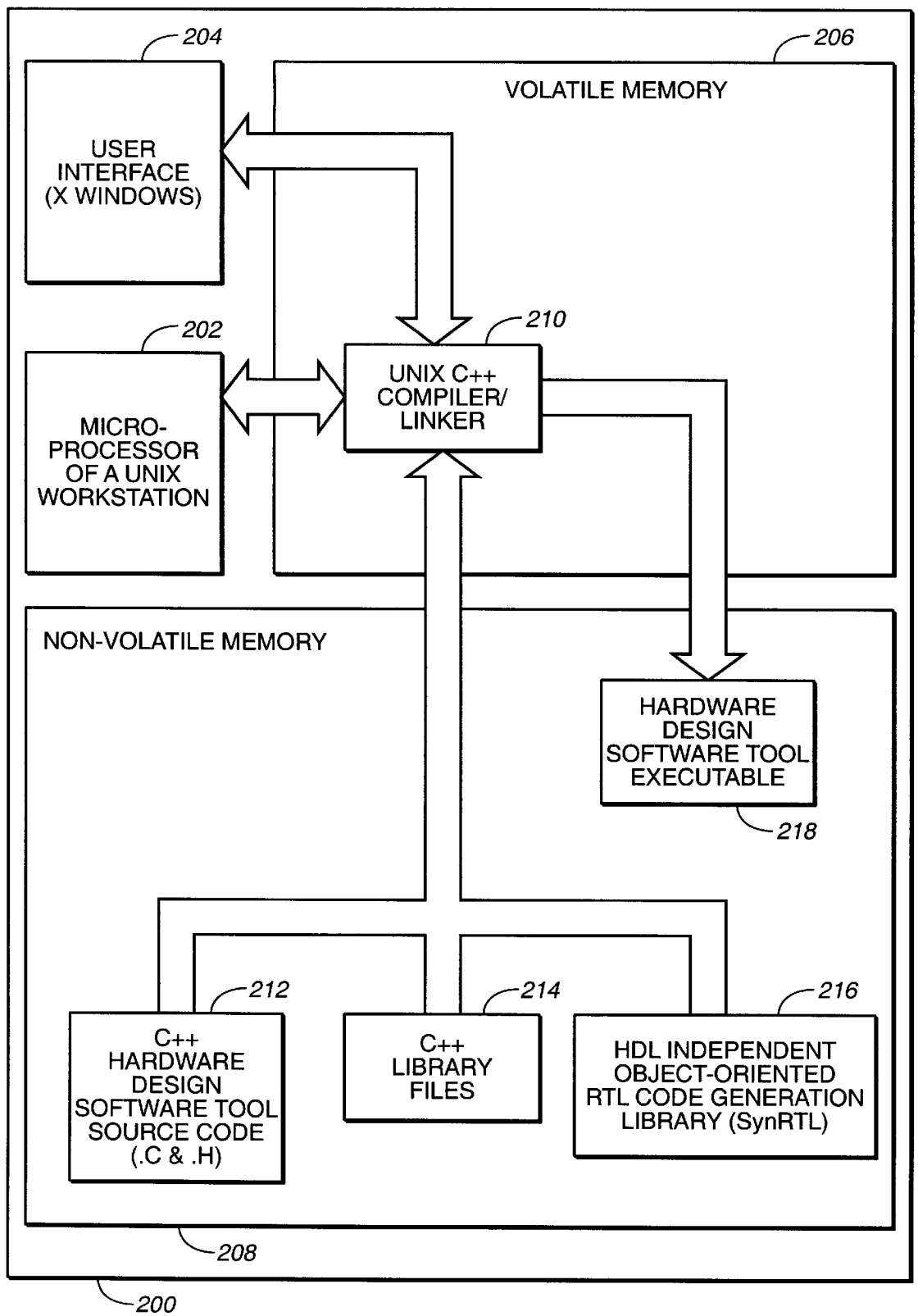
FIG._2

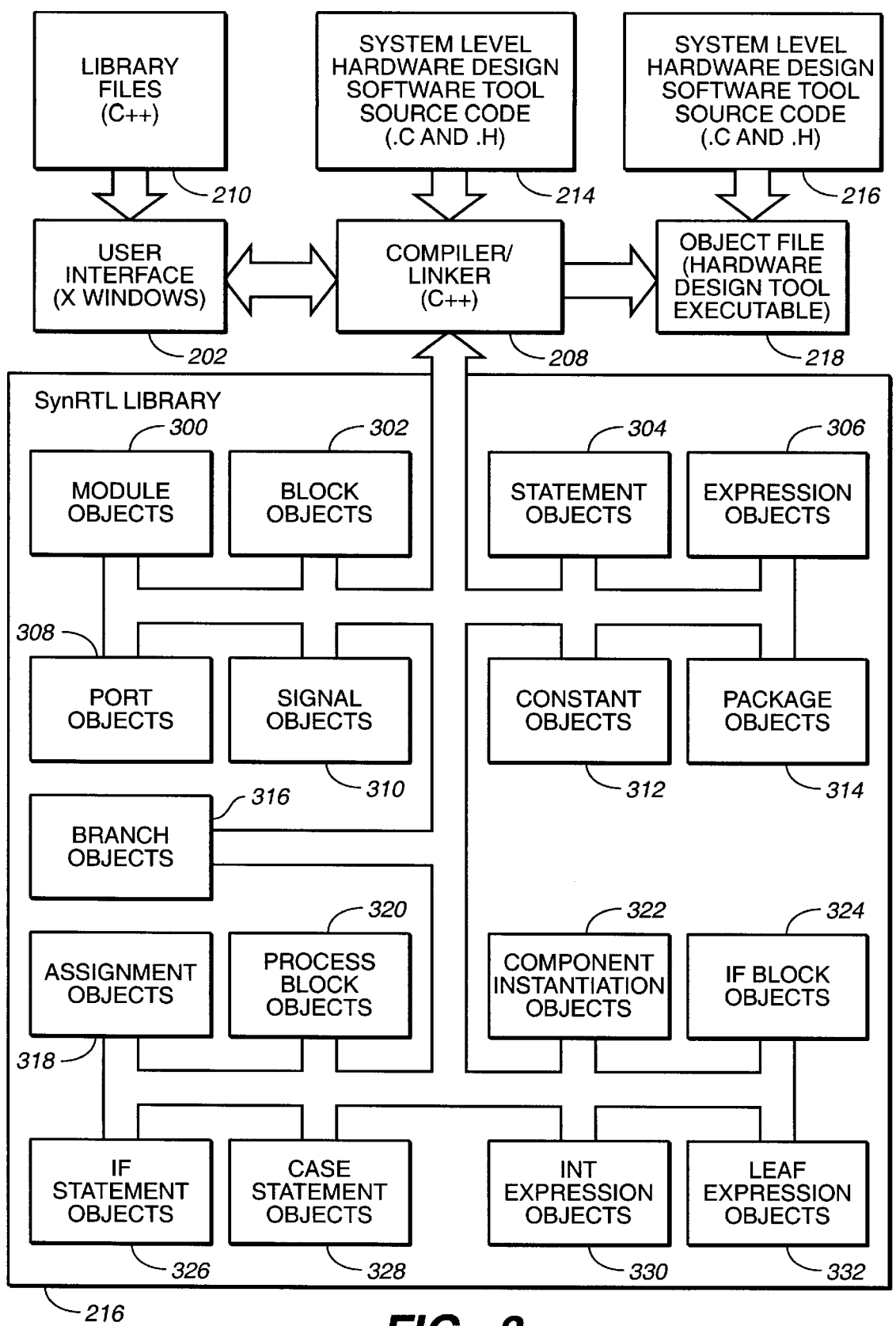
FIG._3

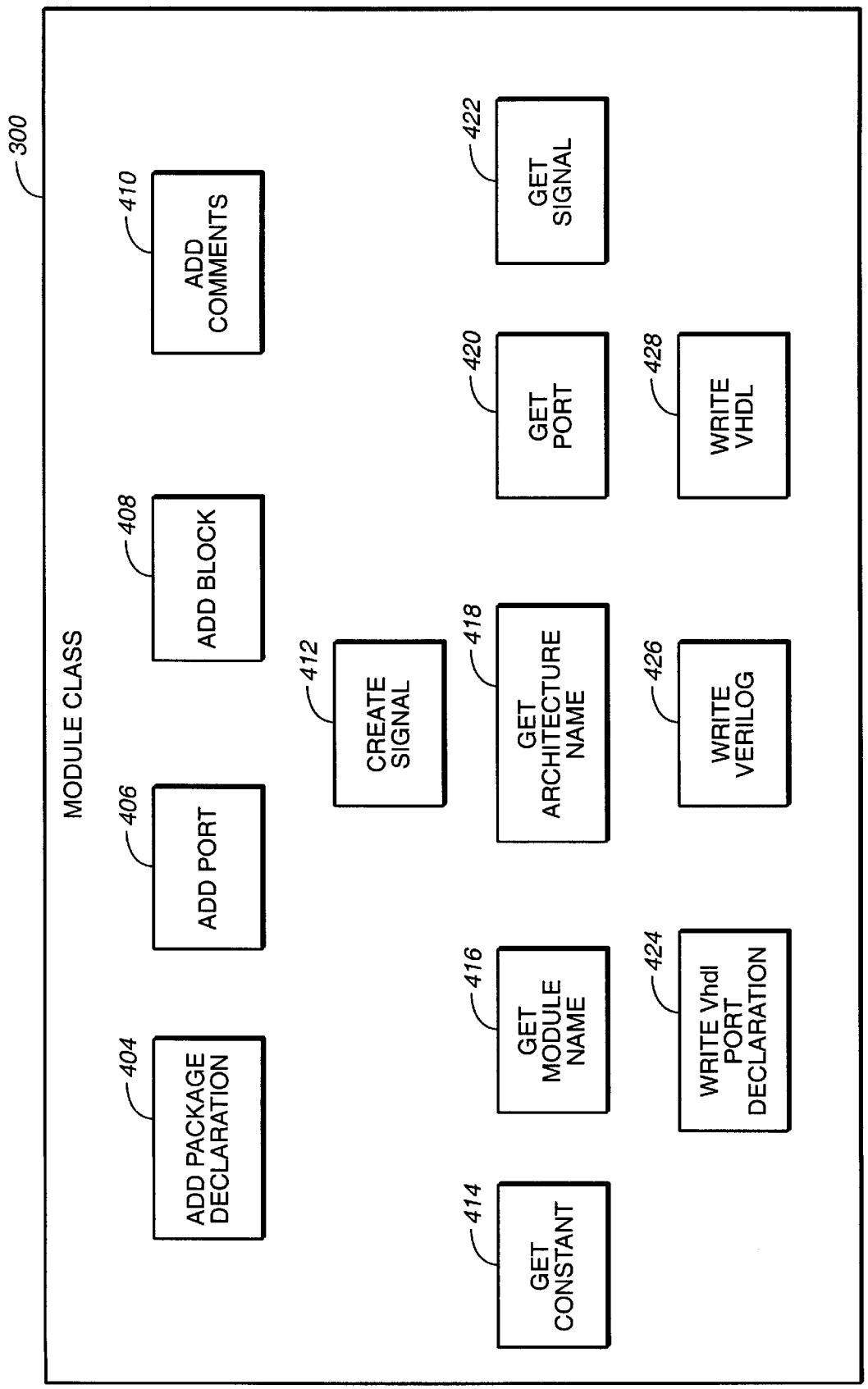
FIG._4

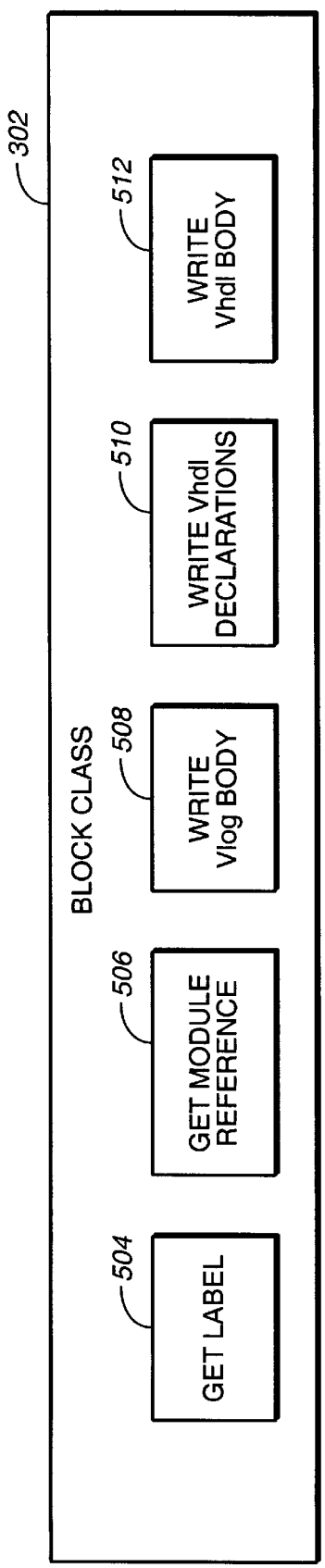
FIG._5
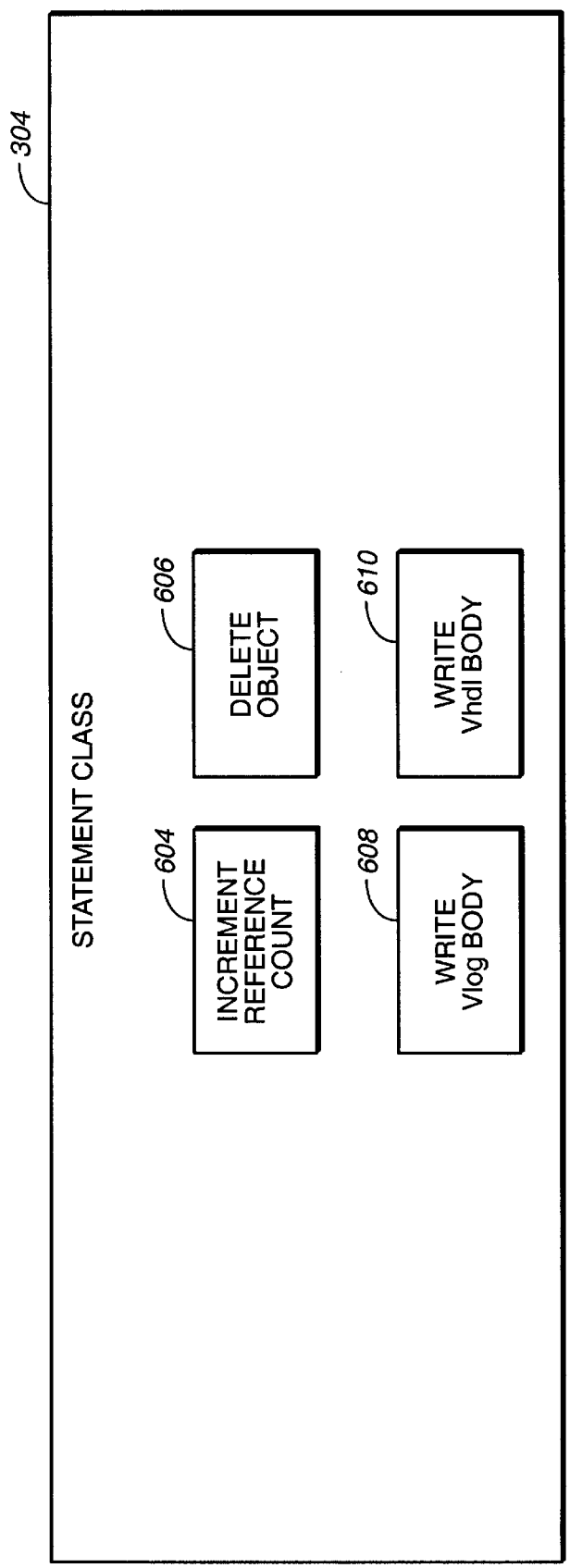
FIG._6

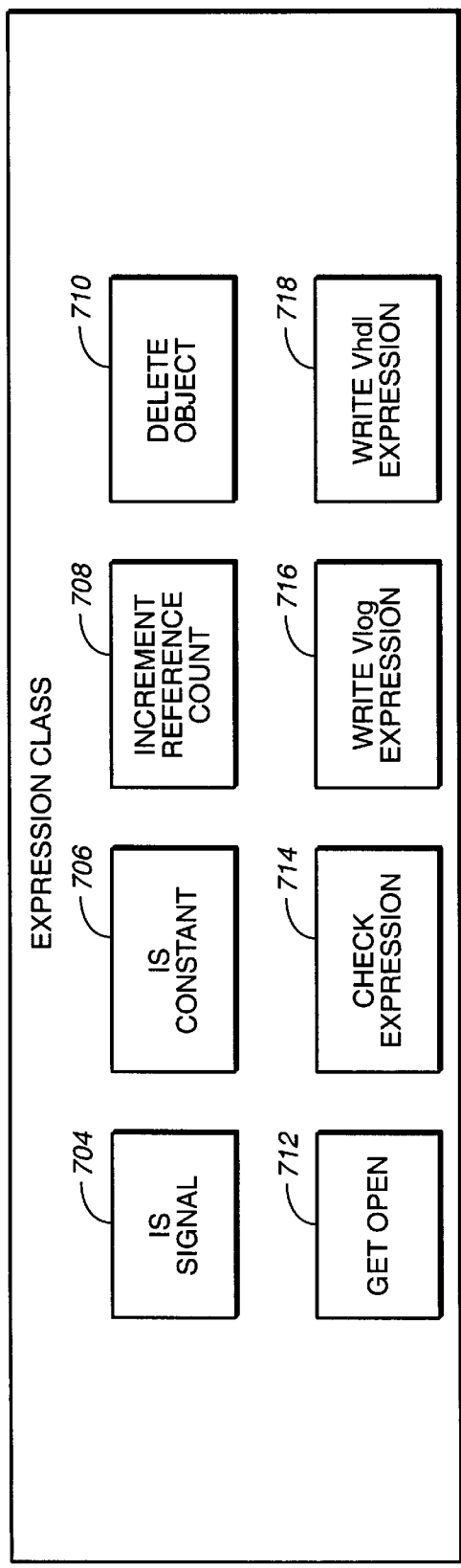
FIG._7
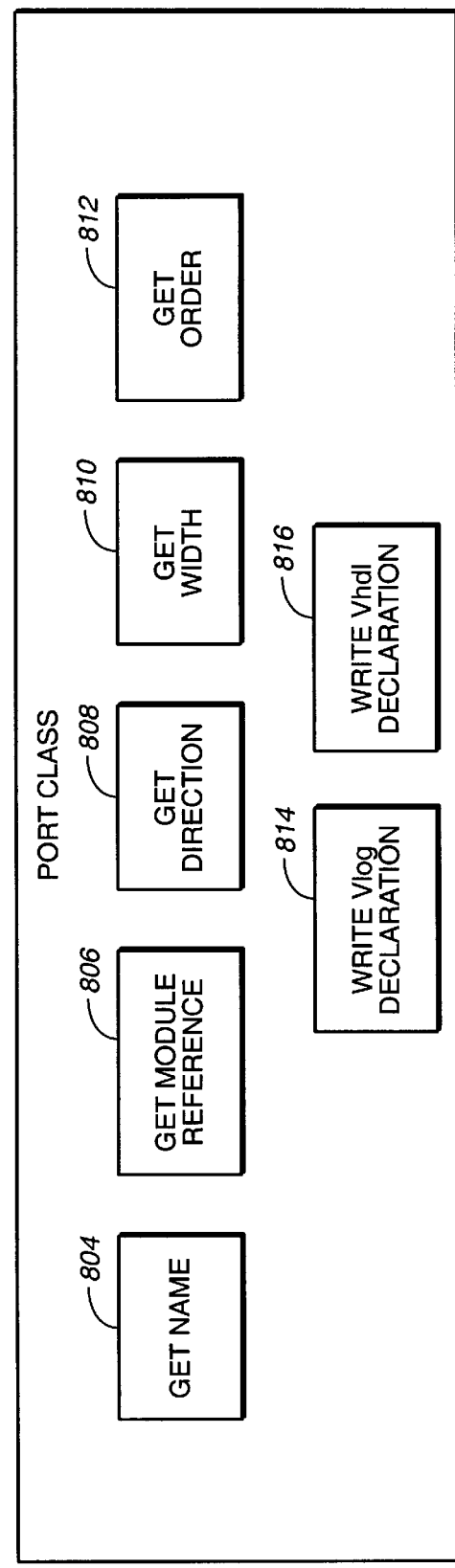
FIG._8

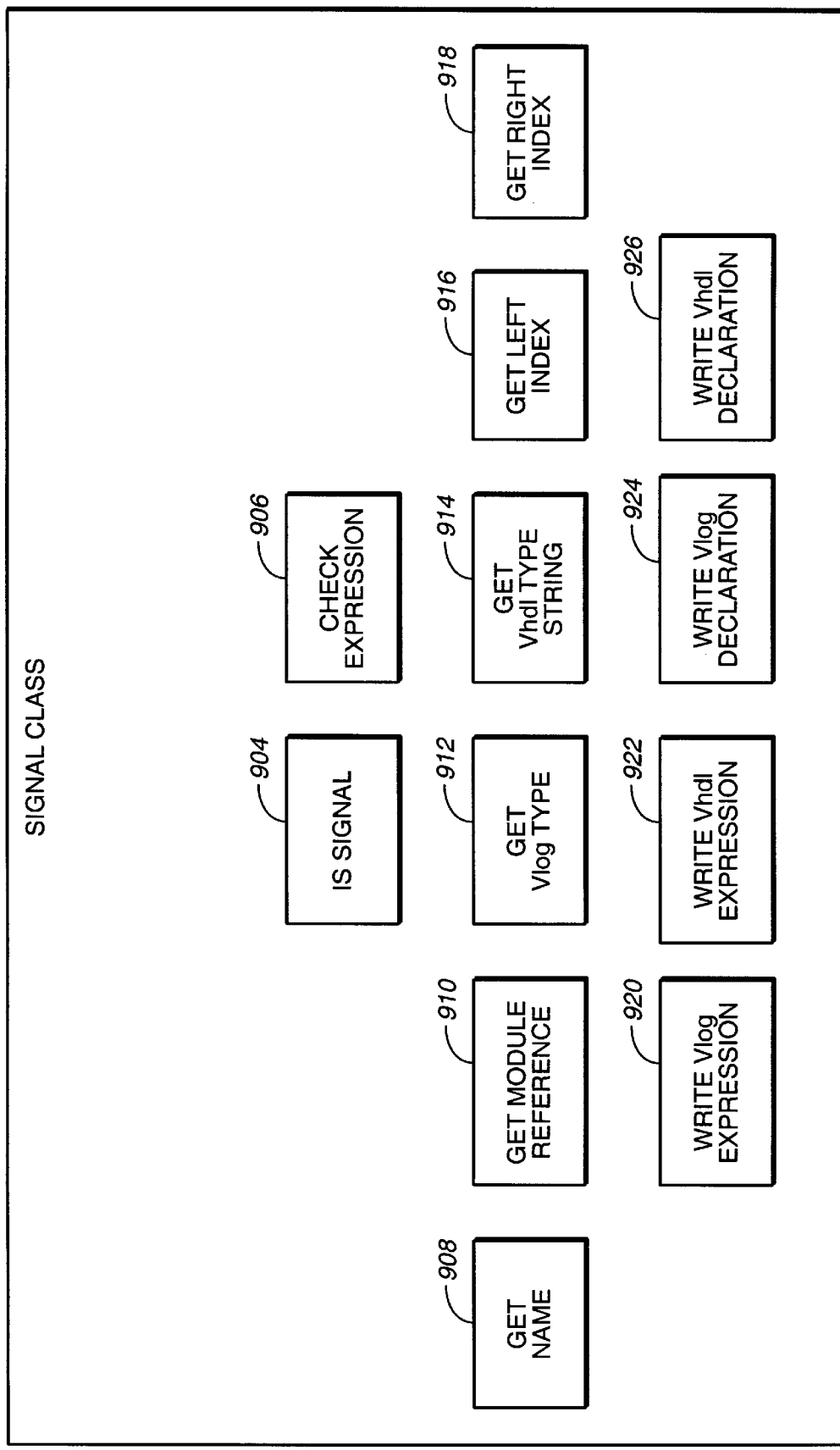
FIG._9

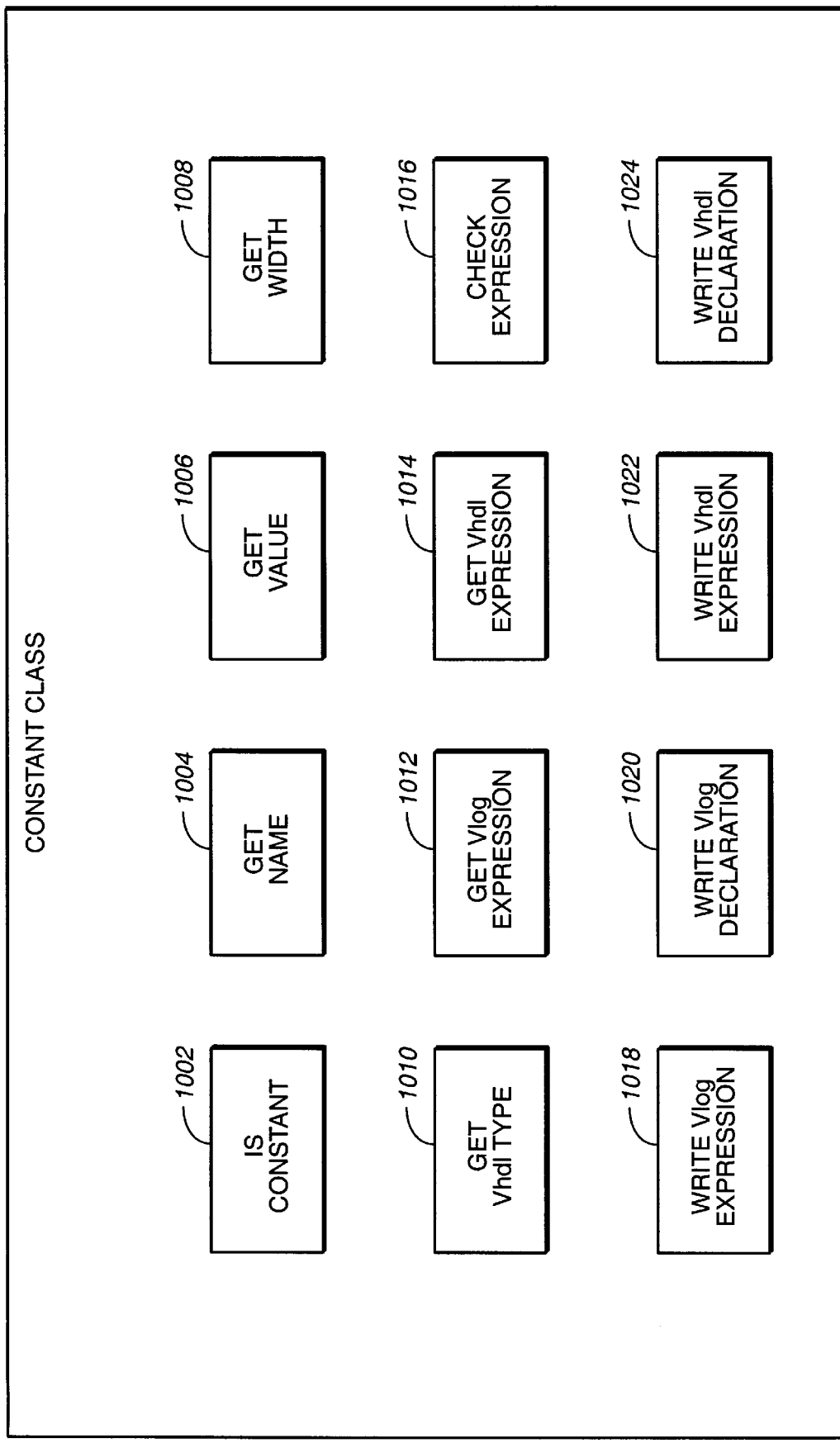
FIG._10

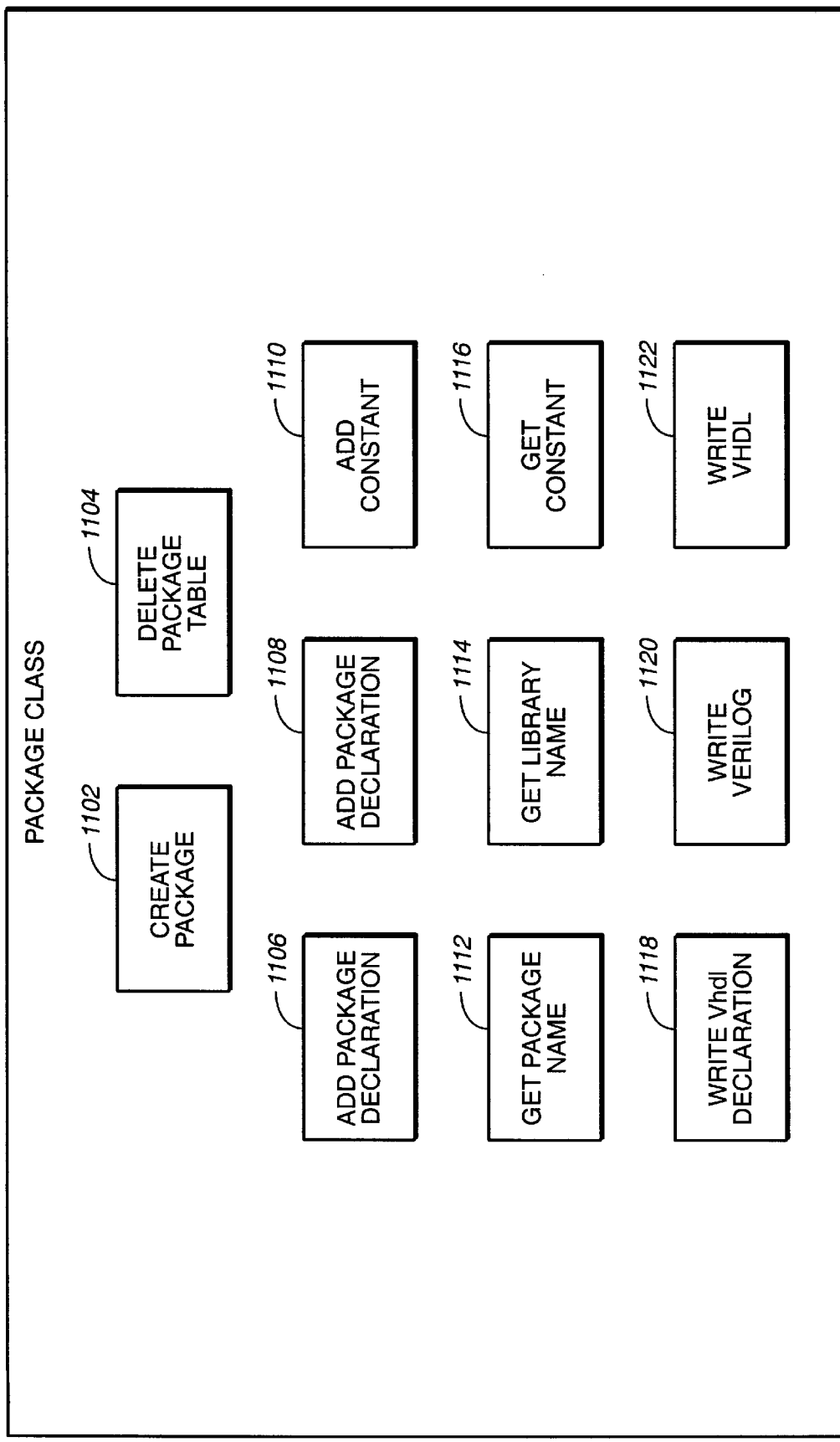
FIG._11

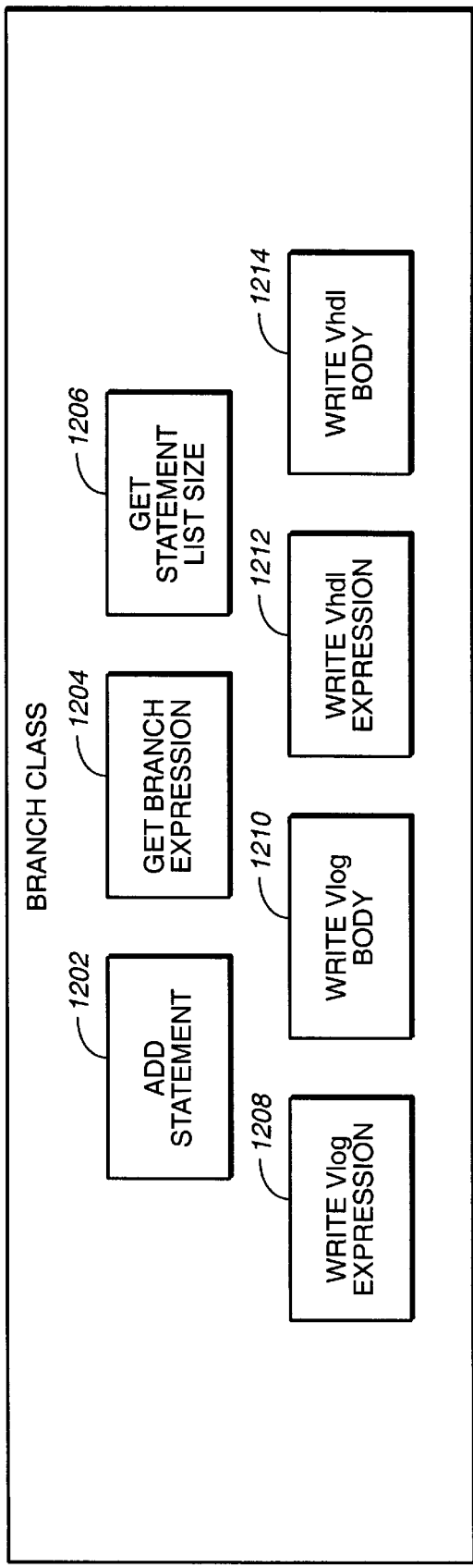
FIG._12
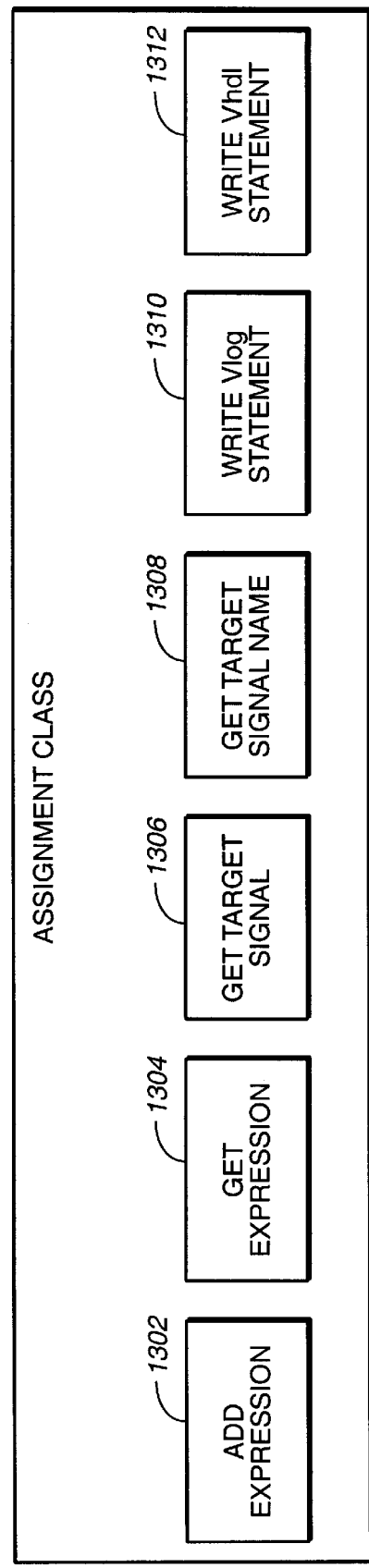
FIG._13

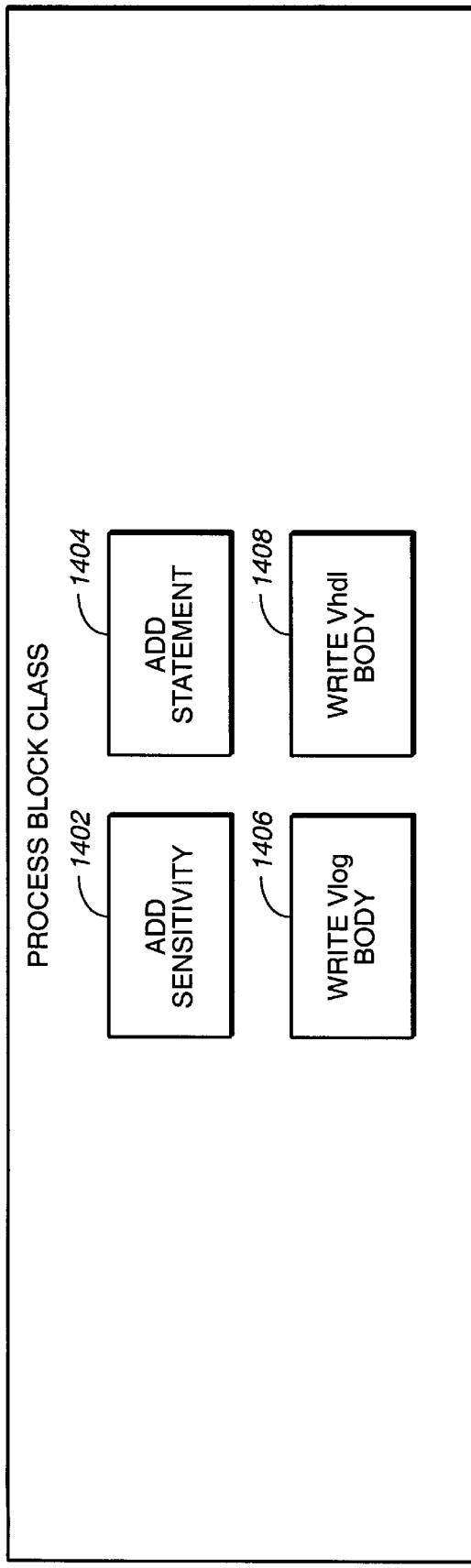
FIG._14
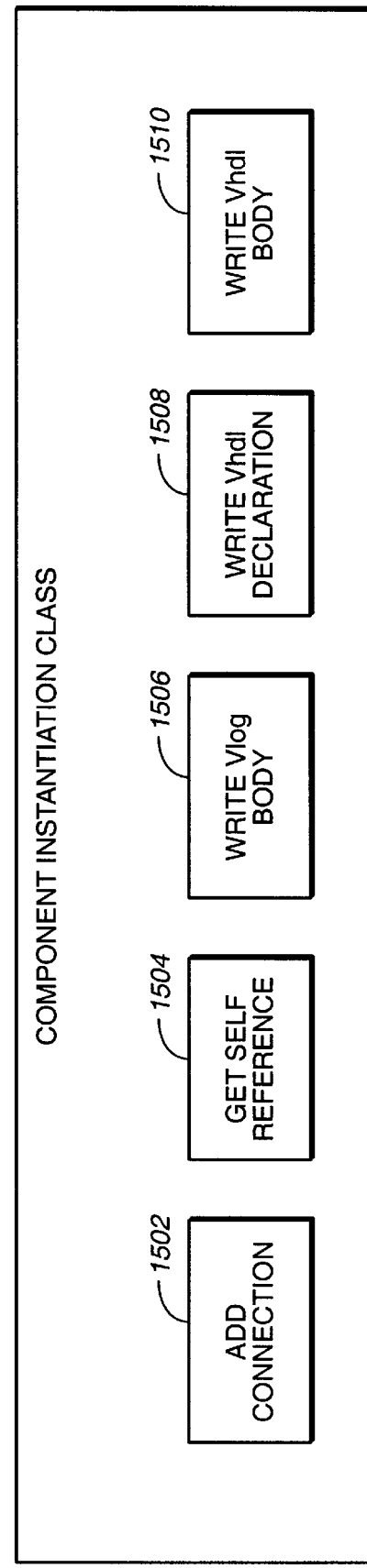
FIG._15

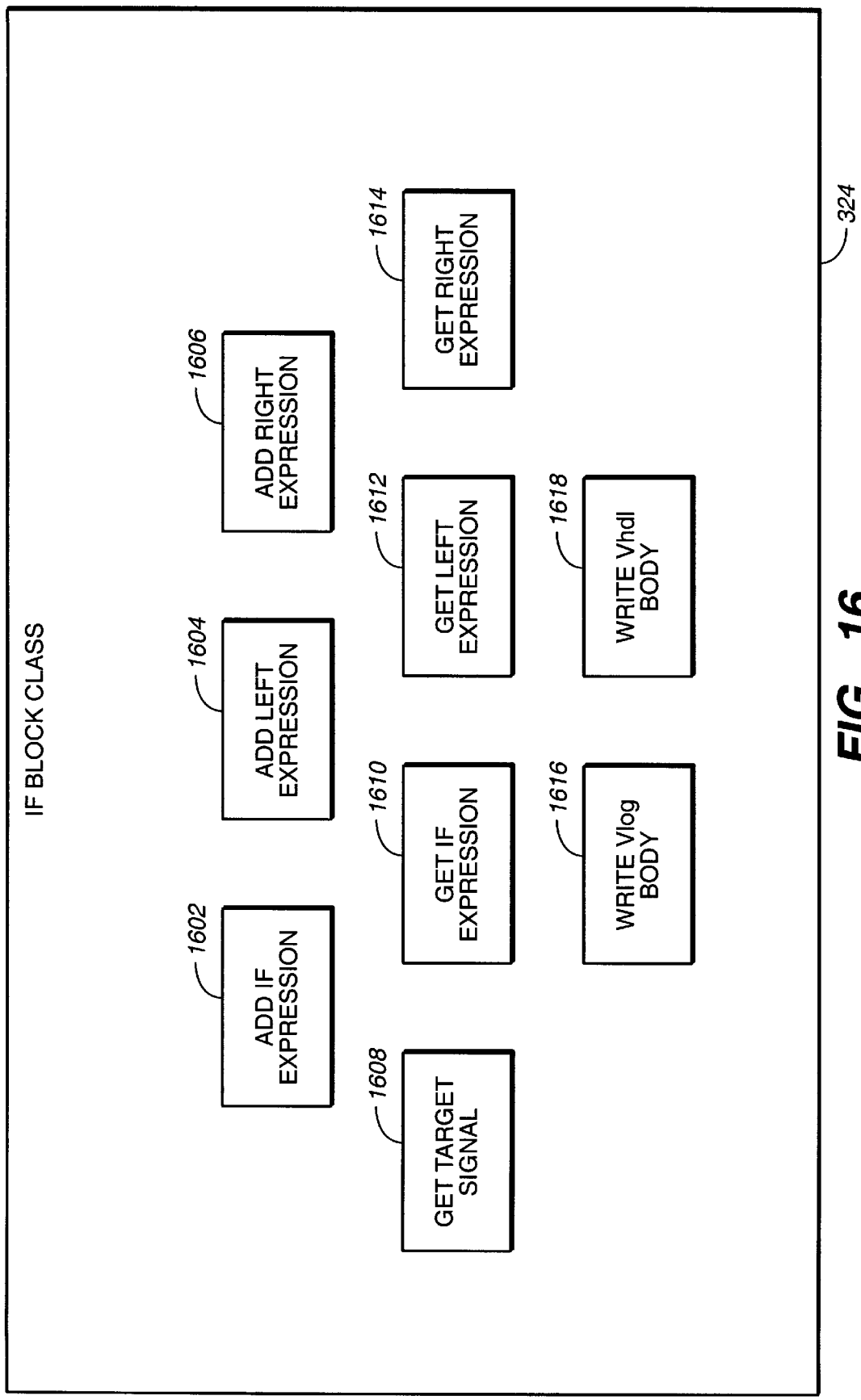
FIG._16

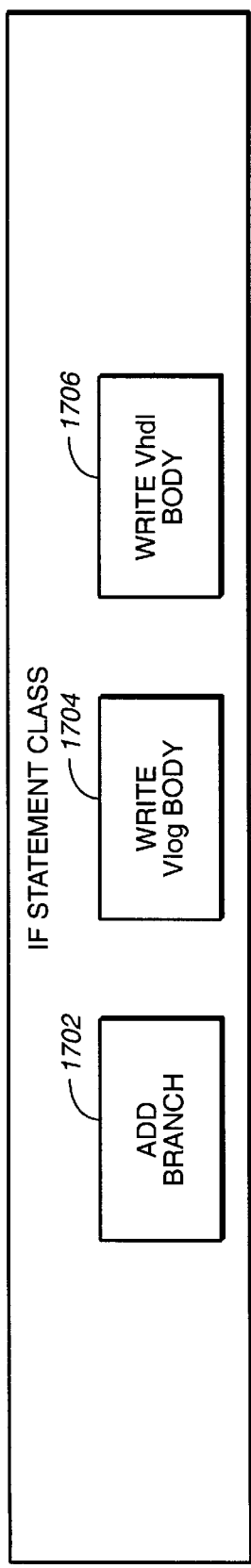
FIG._17
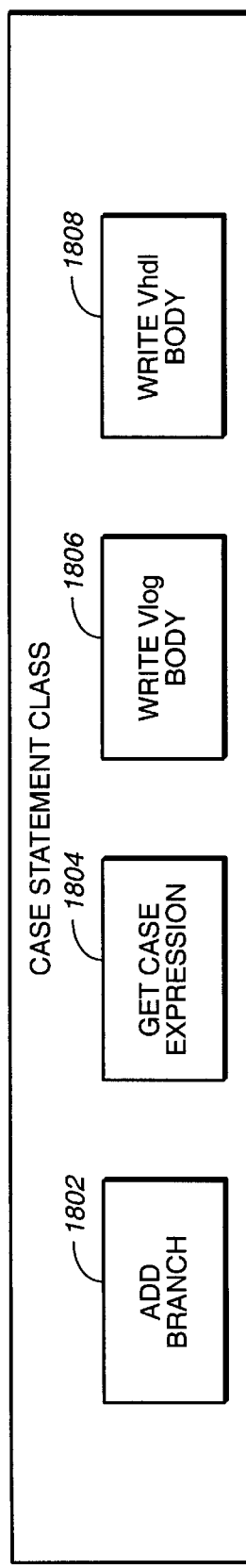
FIG._18
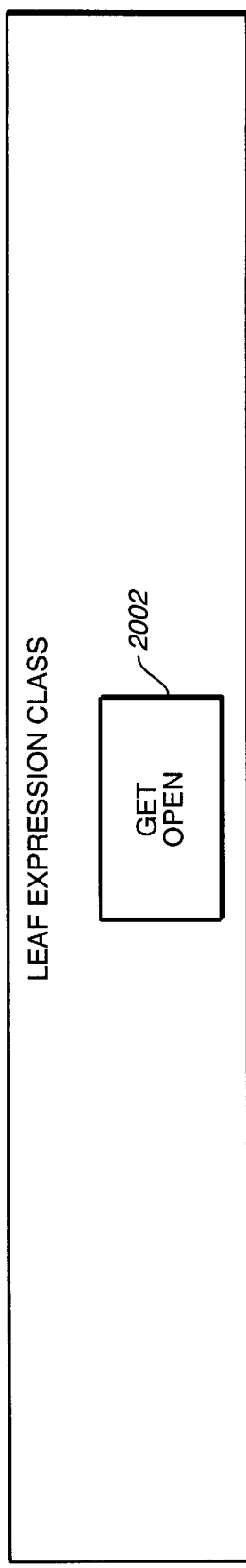
FIG._20

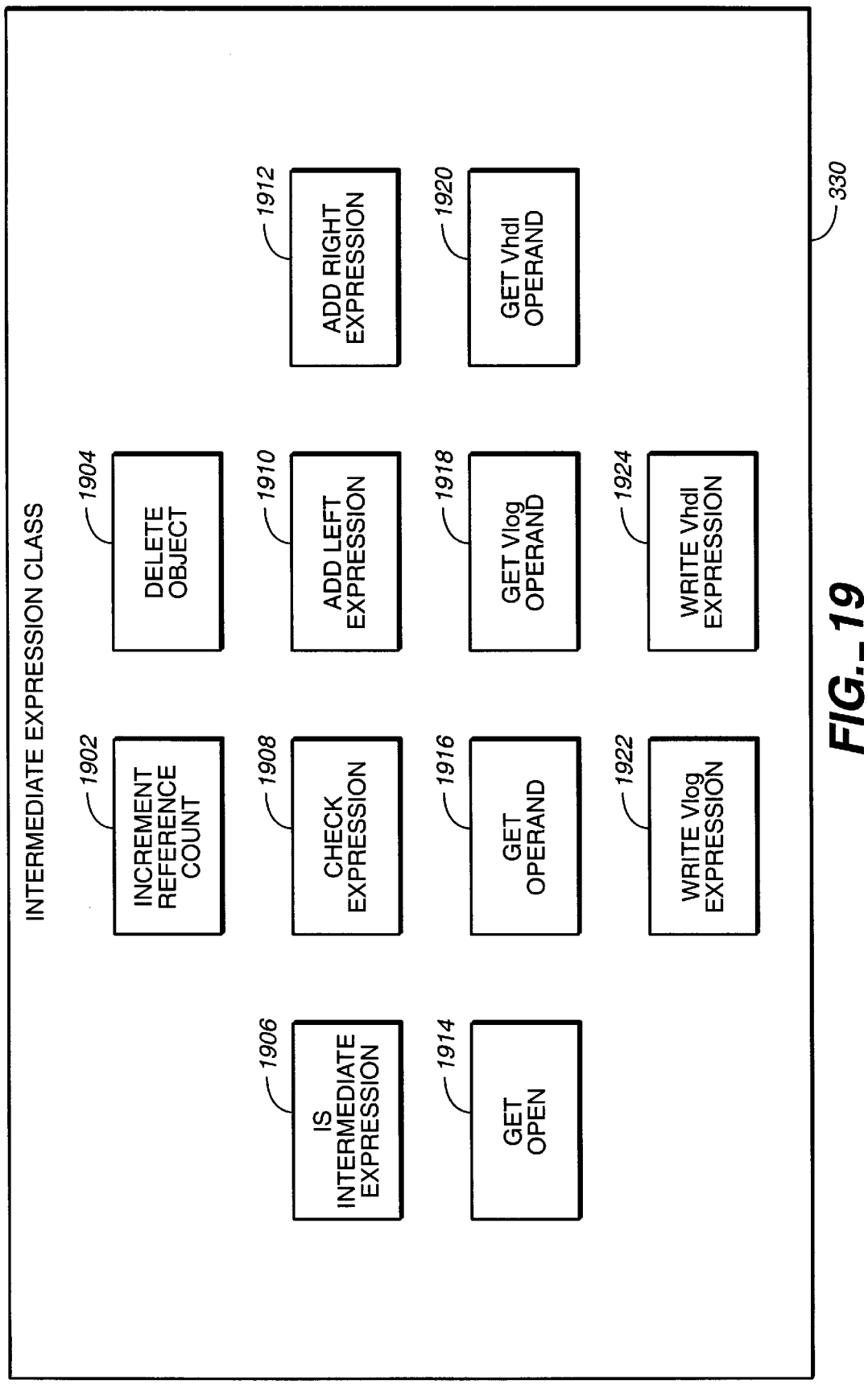
FIG._19

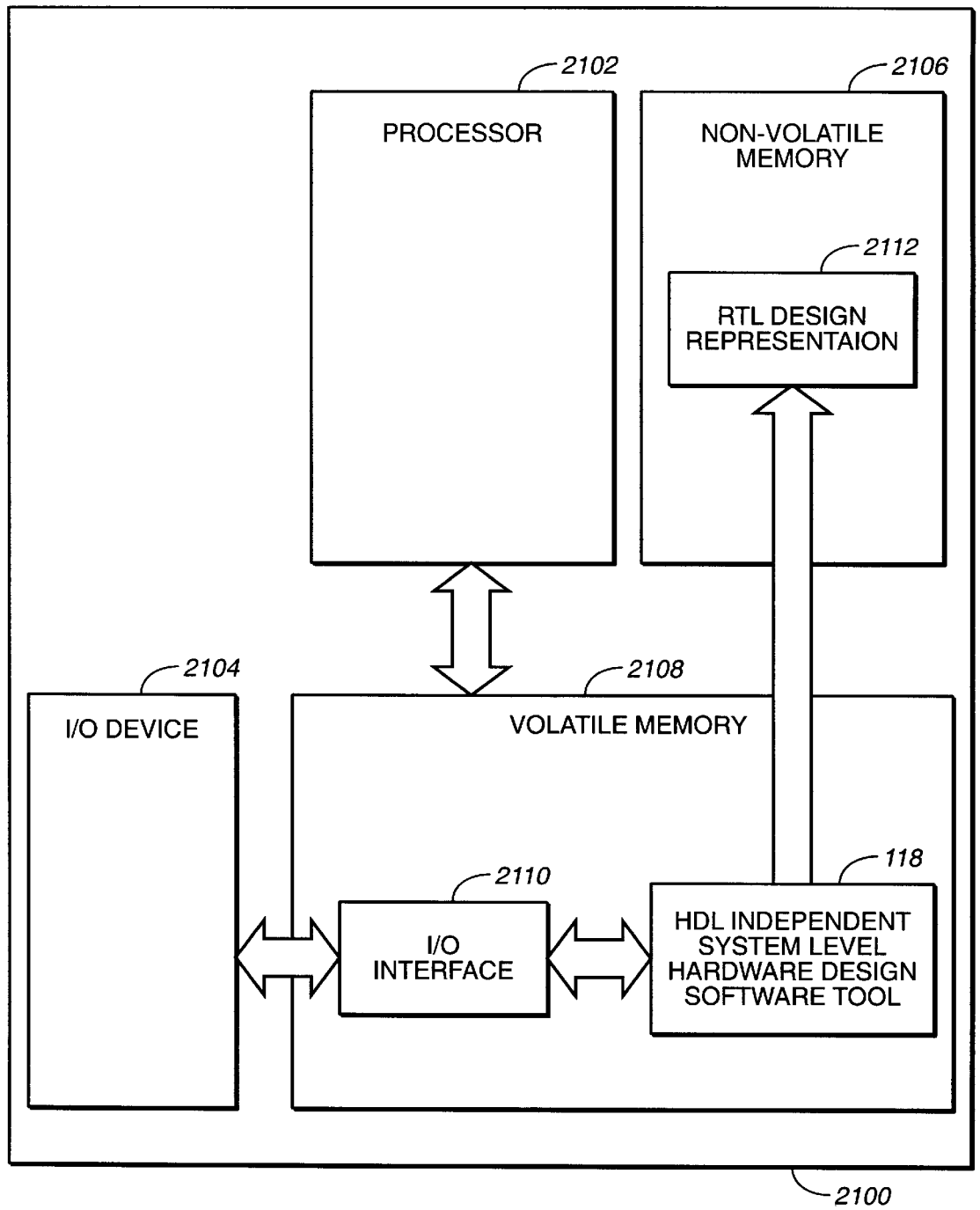
FIG._21

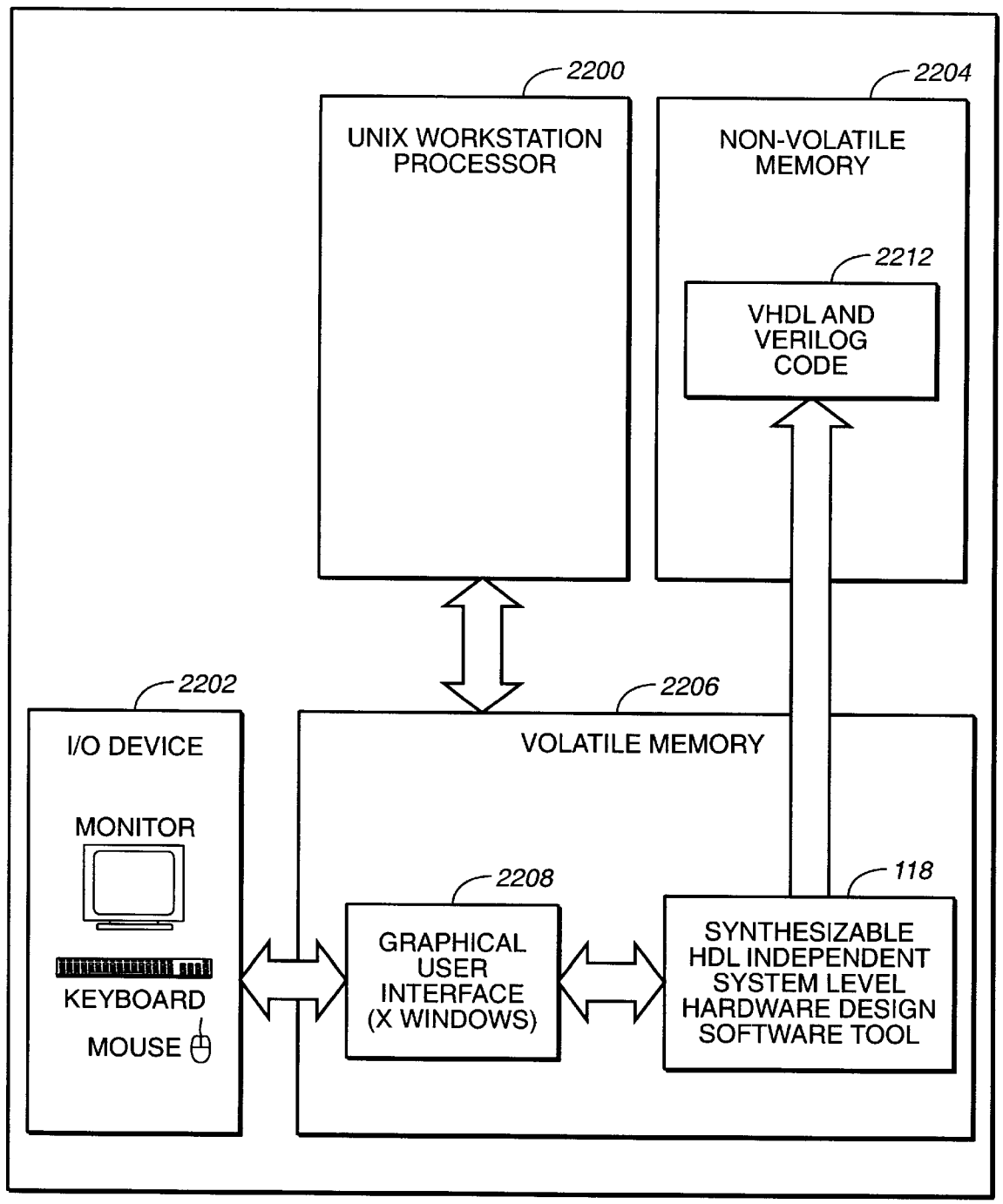
FIG._22

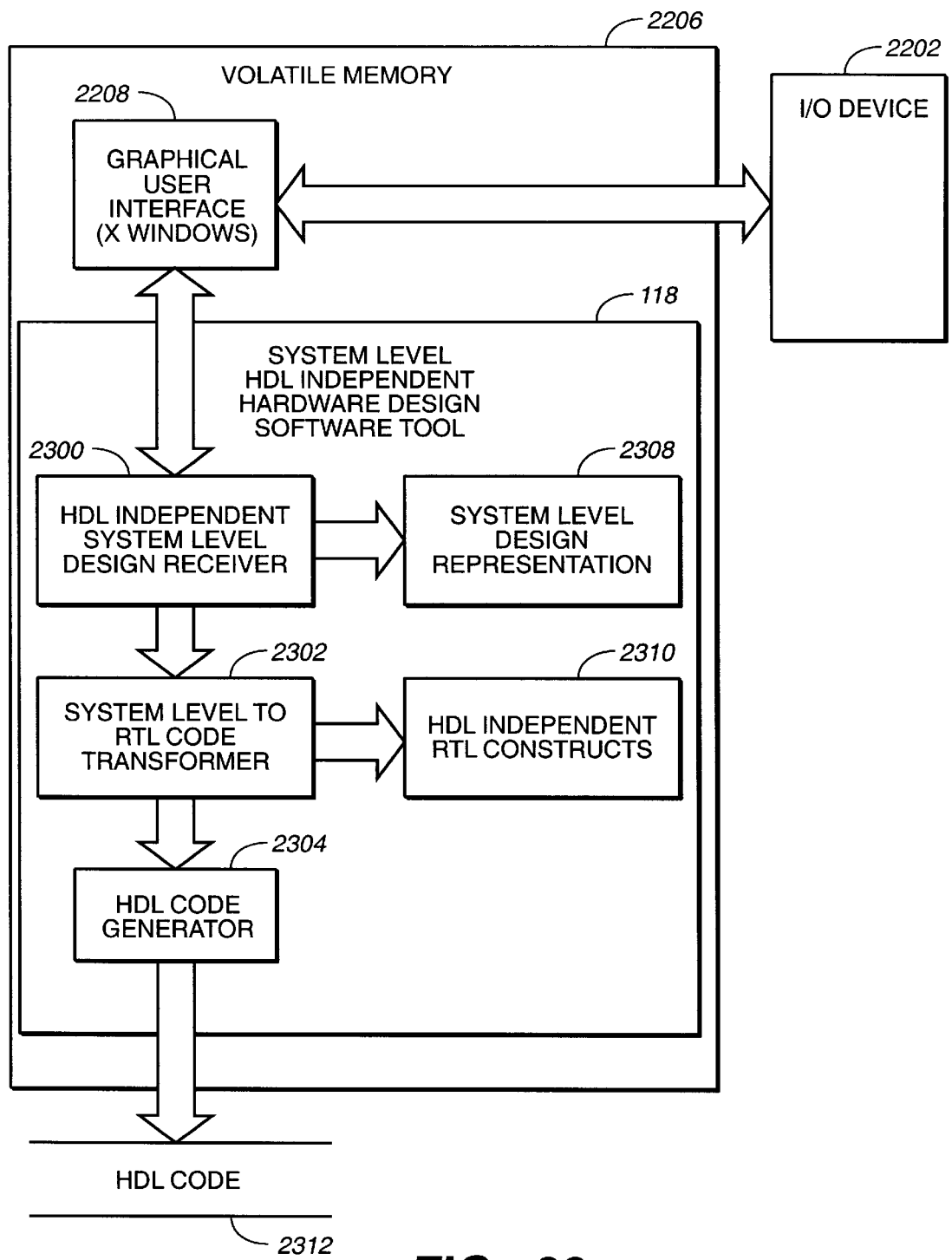
FIG._23

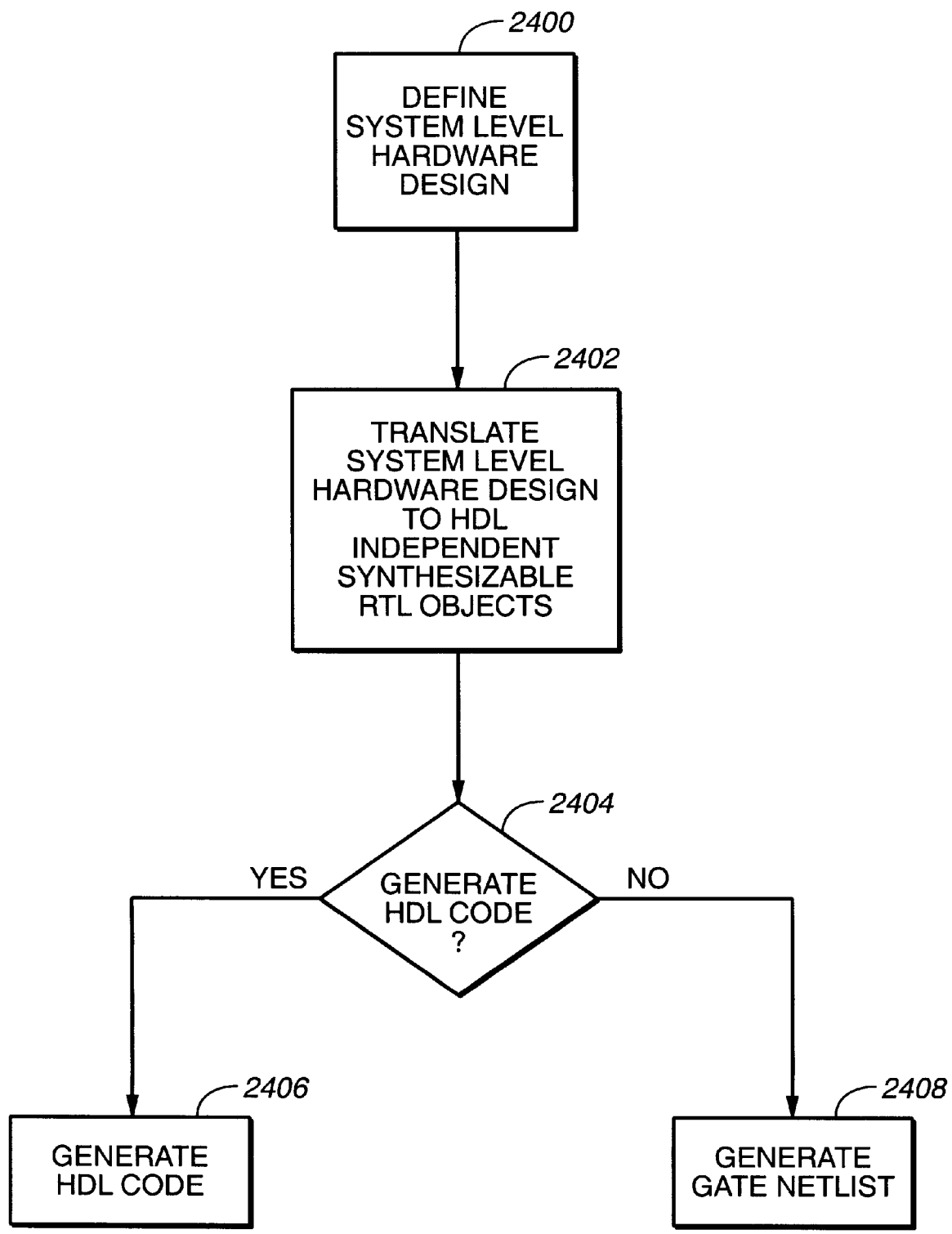
FIG._24

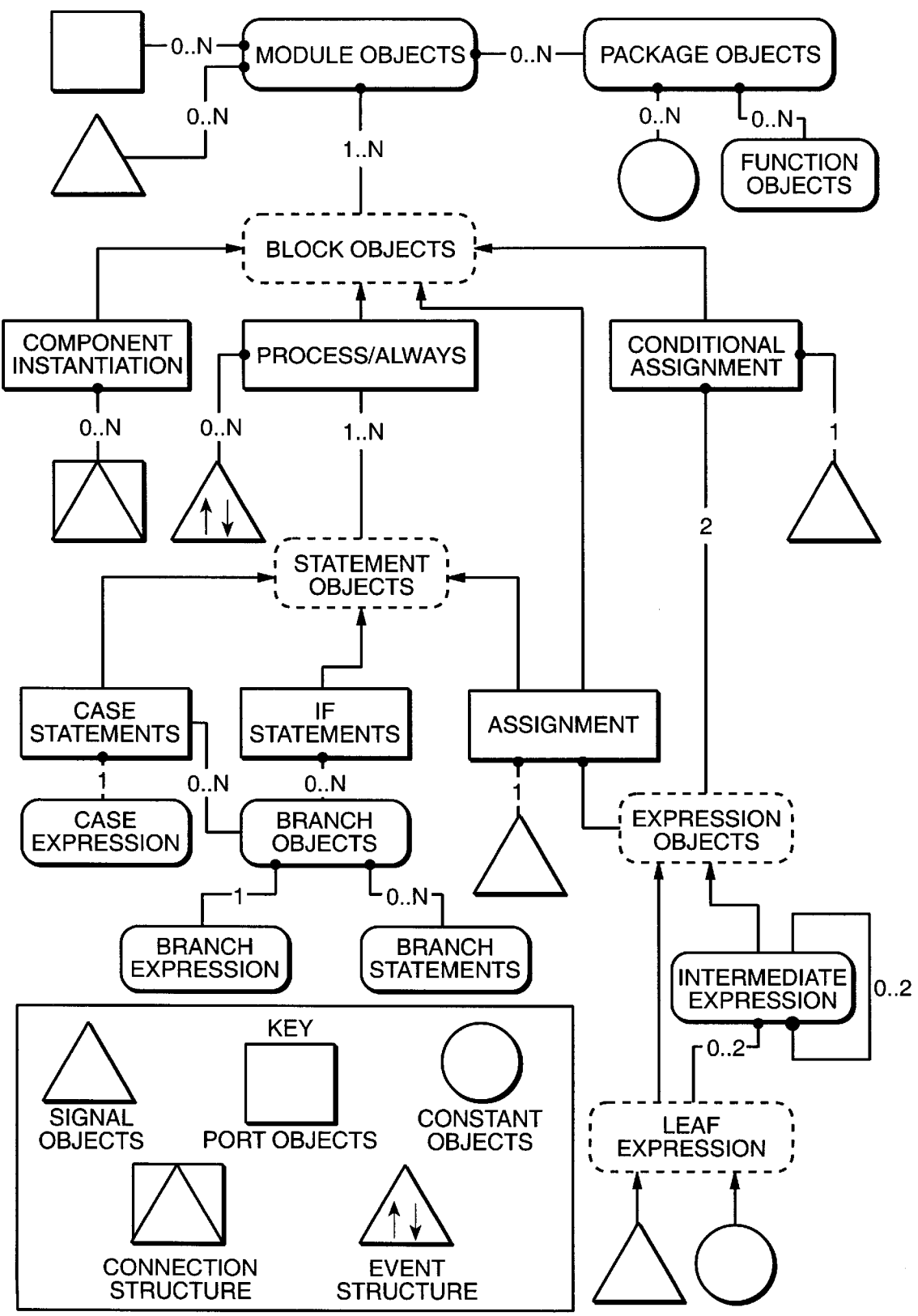
FIG._25

```
module up_down_cnt (clk, rst, up_dn,out);

input clk;
    input rst;
    input up_dn;
    output [15:0] out;

reg [15:0] int_out;
    reg [15:0] out1;

always @ (posedge clk) // Sequential Process
            if (rst == 1'b1)
                    out1 <= 16'b0;
            else
                    out1 <= int_out;

always @(up_dn) // Combinational Process
            if(up_dn == 1'b1)
                    int_out <=out1 + 1;
            else if (up_dn == 1'b0)
                    int_out <= out1 - 1;
            else
                    int_out <= 16'bx;

assign out = out1; // Concurrent Signal Assignment endmodule
```

FIG._26

```
LIBRARY ieee;
USE ieee.std_logic_1164.ALL;

ENTITY up_down_cnt IS
      Port(clk : IN STD LOGIC;
              rst : IN STD_LOGIC;
              up_dn : IN STD_LOGIC;
              out : OUT STD_LOGIC_VECTOR (15 DOWNTO 0)
      );
END;

ARCHITECTURE rtl OF up_down_cnt IS
      SIGNAL int_out : STD_LOGIC_VECTOR (15 DOWNTO 0);
      SIGNAL out1 : STD_LOGIC_VECTOR (15 DOWNTO 0);
      BEGIN PROCESS (clk) -- Sequential Process
      BEGIN
              IF (clk EVENT AND clk = '1')
                    IF (rst = '1)
                            out1 <="0000000000000000";
                    ELSE
                            out1 <= int_out;
                    END IF;
              END IF;
      END PROCESS (up_dn) -- Combinational Process
      BEGIN
              IF (up_dn = '1')
                    int_out <= out1 + 1;
              ELSIF (up_dn = '0')
                    int_out <= out1 - 1;
              ELSE
                    int_out <= "xxxxxxxxxxxxxxxx";
              ENDIF;
      END out <= out1; -- Concurrent Signal Assignment
END rtl
```

FIG._27

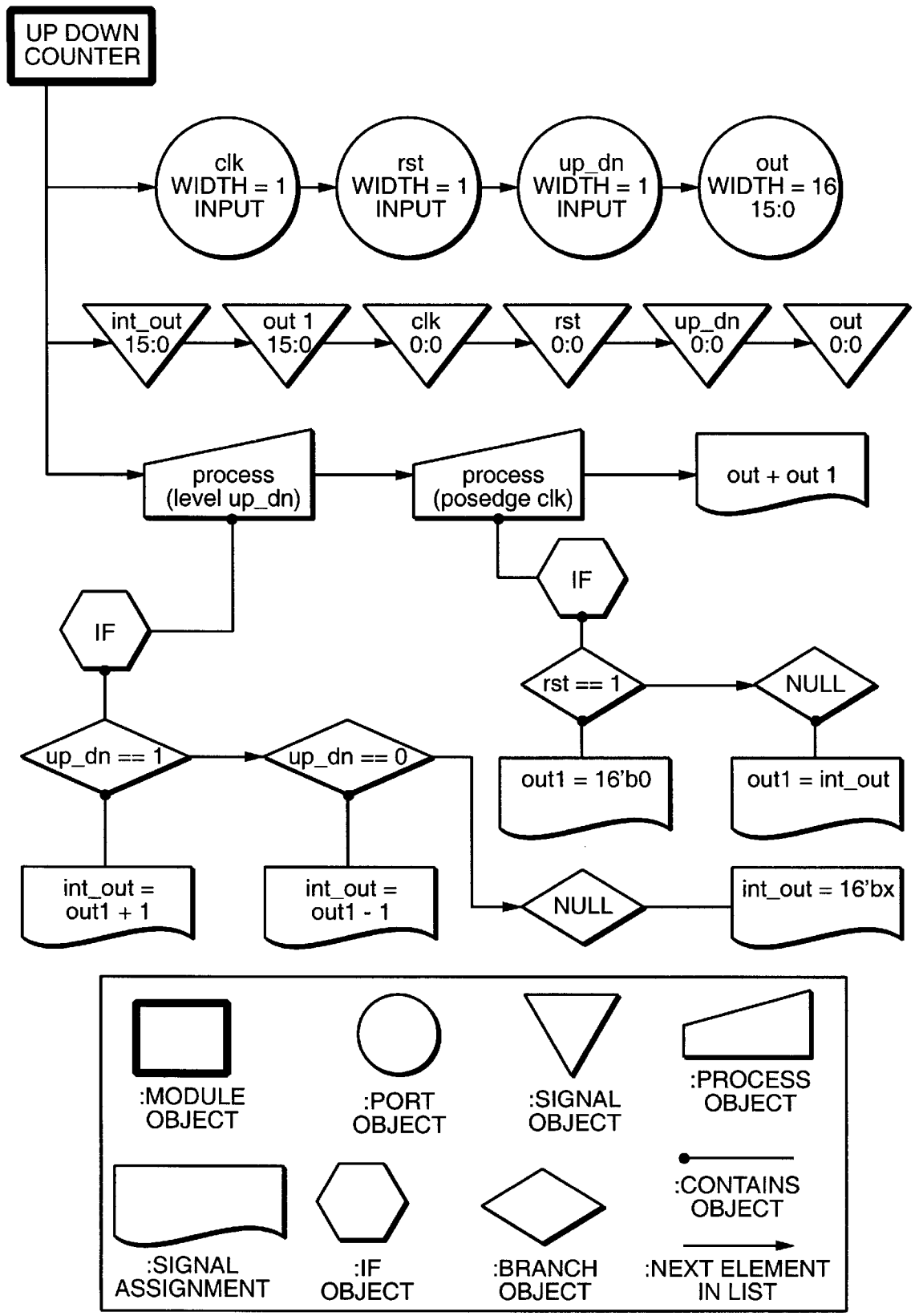
FIG._28

SYSTEM AND METHOD FOR REPRESENTING A SYSTEM LEVEL RTL DESIGN USING HDL INDEPENDENT OBJECTS AND TRANSLATION TO SYNTHESIZABLE RTL CODE

1. FIELD OF THE INVENTION

The invention relates generally to the field of electronic design automation systems, more particularly to representing system level register transfer level ("RTL") hardware designs and translating the design into synthesizable RTL code.

2. BACKGROUND OF THE INVENTION

Conventionally, designers designed the various modules of a chip at the gate level by using a schematic capture technique. In contrast, today, the various modules of a chip are designed at the register transfer level (RTL) using hardware description languages (HDL's). Evolutions of hardware description languages (HDLs) and advances in simulation and synthesis technologies for the HDLs have enabled chip designers to design at a higher (resistor transfer) level of abstraction than at the "gate" level.

When designing at the RTL, the designer describes a module in terms of signals which are generated and propagated through combinational modules from one set of registers to another set of registers. HDLs provide a rich set of constructs to describe the functionality of a module at RTL. At this level, the functionality is described by using high level constructs such as concurrent PROCESS blocks with sensitization lists, IF statements, CASE statements, and assignment statements that use logical operators, arithmetic operators, and relational operators. Verilog and VHDL are the most popular HDLs among designers and both are IEEE standards.

Software tools that are used to design hardware that generate modules at the RTL generally must be capable of generating the modules in both Verilog and VHDL. Although both languages model and describe hardware, their syntax is quite different and some functionalities of these two HDLs are non overlapping. Due to the different syntax and varying functionality of these two languages, a significant amount of effort is required to generate the correct syntax. In addition, conventional systems use two separate code generators, one for Verilog and one for VHDL. The use of two generators makes the task of maintaining the system in synchronization difficult.

What is needed is a system and method for (1) generating an RTL design without requiring detailed knowledge of Verilog and VHDL while (2) making software development and maintenance easier.

SUMMARY OF THE INVENTION

The present invention comprises a system and method for representing a system level RTL hardware design using an HDL independent RTL representation and translation into synthesizable RTL code. The present invention creates an object-oriented library which can be used to implement RTL hardware designs in terms of HDL independent objects. Instead of implementing multiple HDL instances of hardware modules, the invention enables software tool programmers to implement one HDL-independent instance of the hardware module. As a result, a programmer can focus his efforts on generating the functionality of the module and can be relieved from the time consuming task of generating the detailed syntax of multiple HDLs. The present invention also maintains synchronization across multiple HDLs so that a software designer can generate HDL code for any supported HDL, e.g., Verilog or VHDL, thus making software maintenance easier.

BRIEF DESCRIPTION OF THE DRAWINGS

FIG. 1 is an illustration of a computer in which the preferred embodiment of the code generation part of the invention operates.

FIG. 2 is a more detailed illustration of a computer environment in which the preferred embodiment of the code generation part of the invention resides.

FIG. 3 is a more detailed illustration of the HDL independent objected oriented RTL code generation library according to the preferred embodiment of the present invention.

FIG. 4 is a more detailed illustration of the module class according to the preferred embodiment of the present invention.

FIG. 5 is a more detailed illustration of the block class according to the preferred embodiment of the present invention.

FIG. 6 is a more detailed illustration of the statement class according to the preferred embodiment of the present invention.

FIG. 7 is a more detailed illustration of the expression class according to the preferred embodiment of the present invention.

FIG. 8 is a more detailed illustration of the port class according to the preferred embodiment of the present invention.

FIG. 9 is a more detailed illustration of the signal class according to the preferred embodiment of the present invention.

FIG. 10 is a more detailed illustration of the constant class according to the preferred embodiment of the present invention.

FIG. 11 is a more detailed illustration of the package class according to the preferred embodiment of the present invention.

FIG. 12 is a more detailed illustration of the branch class according to the preferred embodiment of the present invention.

FIG. 13 is a more detailed illustration of the assignment class according to the preferred embodiment of the present invention.

FIG. 14 is a more detailed illustration of the process block class according to the preferred embodiment of the present invention.

FIG. 15 is a more detailed illustration of the component instantiation class according to the preferred embodiment of the present invention.

FIG. 16 is a more detailed illustration of the IF block class according to the preferred embodiment of the present invention.

FIG. 17 is a more detailed illustration of the IF statement class according to the preferred embodiment of the present invention.

FIG. 18 is a more detailed illustration of the case statement class according to the preferred embodiment of the present invention.

FIG. 19 is a more detailed illustration of the intermediate expression class according to the preferred embodiment of the present invention.

FIG. 20 is a more detailed illustration of the leaf expression class according to the preferred embodiment of the present invention.

FIG. 21 is an illustration of a computer in which the preferred embodiment of the code execution portion of the preferred embodiment operates.

FIG. 22 is a more detailed illustration of a computer in which the preferred embodiment of the code execution portion of the preferred embodiment operates.

FIG. 23 is a more detailed illustration of the synthesizable hardware description language independent system level hardware design tool according to the preferred embodiment of the present invention.

FIG. 24 is a flow diagram showing the method of the code execution portion of the preferred embodiment of the present invention.

FIG. 25 is an object relation diagram detailing the relation of the object-oriented objects of the SynRTL library according to the preferred embodiment of the present invention.

FIG. 26 is an illustration of an up-down counter described using synthesizable Verilog code according to the preferred embodiment of the present invention.

FIG. 27 is an illustration of an up-down counter described using synthesizable VHDL code according to the preferred embodiment of the present invention.

FIG. 28 is an illustration of the object hierarchy for an up-down counter using the SynRTL library 116 of the present invention.

DETAILED DESCRIPTION OF THE PREFERRED EMBODIMENTS

A preferred embodiment of the present invention is now described with reference to the Figures where like reference numbers indicate identical or functionally similar elements. Also in the Figures, the left most digit(s) of each reference number corresponds to the Figure in which the reference number is first used.

As described above, hardware description languages (HDLs) are used to describe a hardware design at the register transfer level (RTL) in terms of signals that are generated and propagated through combinational modules from one set of registers to another set of registers. The functionality of a module is described by using high level constructs, as described above. The scope of describing designs at the RTL in HDL languages is quite large, a rich set of constructs and functionalities are available to describe any design. However, only a limited set of these constructs are synthesizable. That is, only a small subset of all of the available constructs can be taken through automated synthesis tools like the Design Compiler that is commercially available from Synopsys, Mountain View, Calif., to generate gate level netlists in terms of the cells from a target technology library provided by the semiconductor vendor. This limited set of synthesizable RTL constructs is referred to herein as synthesizable RTL.

As described above, although Verilog and VHDL perform similar functions, their syntax is significantly different and some functionalities of these two HDLs do not overlap. However, the present invention identifies the synthesizable RTL subset of constructs in Verilog and VHDL to offer nearly identical functionality although the syntax of these subsets remains significantly different. As described below, the present invention identifies the synthesizable RTL constructs as HDL independent classes that are implemented in a class library that is used by the designer. A software designer using the present invention generates a synthesizable RTL design by instantiating objects from the class library and executing the defined member functions of the class library. Once the RTL module is constructed in the HDL independent form, the present invention can convert the HDL independent form into either Verilog, VHDL, or both using a class member function provided in the class library. Accordingly, the designer does not need to know the specific syntax of either Verilog or VHDL. The operation of the present invention is described below with reference to the Figures. The invention includes two portions, the first portion generates the HDL independent object-oriented library which is referred to herein as "SynRTL", the second portion is the use of the library to generate an HDL independent design representation. A more detailed description of Verilog in set forth in Thomas and Moorby, *The Verilog Hardware Description Language,* Kluwer Academic Publishers (1990), which is incorporated by reference herein in its entirety, and a more detailed description of VHDL is set forth in Lipsett et al., VHDL: Hardware Description and Design, Kluwer Academic Publishers (1989) which is incorporated by reference herein in its entirety.

The present invention is preferably a software program that is stored within a computer system as shown in FIG. 1. The computer system 100 includes a conventional processor 102, a user interface 104, and memory 106, 108. In the preferred embodiment, non-volatile memory 106 and volatile memory 108 are used. A conventional language compiler/linker 110, source code 112 (generated by the user), library files 114, and the HDL independent object-oriented RTL library code 116 are stored within the volatile memory. The language compiler/linker and library files are conventional and are readily available from Sun Microsystems, Mountain view, Calif. The source code files are generated by a hardware design software tool designer/programmer. The HDL independent object-oriented RTL code library includes a programming library which implements object-oriented objects and operations needed for the synthesizable constructs of the desired HDLs. The present invention produces executable object code 118 by compiling and linking the source code with the conventional library files and the HDL independent object-oriented RTL code library 116. The system and method for generating the HDL independent objected oriented RTL code library 116 is described below.

FIG. 2 illustrates a more detailed environment in which the preferred embodiment of the invention resides. In the preferred embodiment the processor 102 is a microprocessor of a UNIX workstation 202. A graphical user interface (GUI) 204, such as X-windows, from the Massachusetts Institute of Technology (MIT), is used as the user interface 104. The non-volatile memory 106 is a conventional hard disk storage device 208. In the preferred embodiment the microprocessor 202 does not directly communicate with the hard disk storage 208. However, in alternative embodiments, the hard disk storage 208 is coupled directly to the microprocessor 202. The C++ hardware design software tool source code 212, C++ library files 214, and HDL independent object-oriented RTL code generation library 216 are stored within the hard disk storage 208 as UNIX files.

FIG. 3 includes a detailed illustration of the preferred embodiment of the SynRTL library 216 of the present invention. The SynRTL library 216 includes a set of classes and associated functions. The set of classes includes module classes 300, block classes 302, statement classes 304, expression classes 306, port classes 308, signal classes 310, constant classes 312, package classes 314, branch classes 316, assignment classes 318, process block classes 320, component instantiation classes 322, if block classes 324, if statement classes 326, case statement classes 328, intermediate expression classes 330, and leaf expression classes 332. The SynRTL library is generated by identifying the common functionality that is inherent in the synthesizable RTL constructs of Verilog and VHDL. This aspect of the present invention identifies the presence and nature of the common functionality and represents the common functionality using an object-oriented methodology. In the preferred embodiment, the C++ computer programming language is used to implement the object-oriented representation. The present invention identifies the constructs of Verilog and VHDL and groups the constructs into eight categories or objects. The eight categories are defined as the following eight objects. (1) Module objects 300—the RTL code for both Verilog and VHDL includes a hierarchy of modules or entities each of which is represented as a module object in the present invention. (2) Concurrent block or concurrent process objects—within a module the main body of the RTL code is represented as a set of concurrent blocks or processes that are represented as block objects. The types of block objects of the present invention include "always blocks," "process blocks," "signal assignment," and "component instantiation" blocks. (3) Statement objects—each concurrent block or process includes a set of sequential statements, these are represented as statement objects. For synthesizable RTL only a few types of statements are allowed, e.g., IF statements, CASE statements, and assignment statements. (4) Expression objects—expressions are part of statements in both Verilog and VHDL. They appear in assignment statement (or blocks), if statements and case statements. (5) Port objects—The ports of a module (or entity) are represented as port objects. (6) Signal objects—The two data types of Verilog (reg and wire) are captured within signal objects. (7) Constant objects for representing constants—three different types of constants (single bit, bit vectors and integers) appear in SynRTL constructs almost exclusively within expressions. For readability of code they may either be named or nameless. (8) Package objects—package objects are used to account for and define the named constants used in the body of RTL code. Package objects can also be used to implement some functions for VHDL.

The identification of these HDL independent object-oriented decompositions is one of the features of the present invention with respect to the design of the SynRTL framework. As described above, synthesizable RTL code, irrespective of the HDL it is written in, can be decomposed into these HDL independent objects. The present invention identifies that by reversing this process, the functionality of a hardware module can be represented in terms of these HDL independent objects and synthesizable RTL code can be generated from within these objects in the desired HDL.

Each of the above identified object categories is captured/designed as a C++ class and a hierarchy of classes is created by the present invention. Additional classes have been designed and added to this hierarchy to complete the design of the object-oriented representation of the SynRTL constructs.

The class definitions are described below with respect to FIGS. 3–20 where the objects illustrated in FIG. 3 are represented as a C++ class. These classes have a simple and flexible user interface. These design considerations enable the user to easily and robustly map the functionality of the module being generated to an object-hierarchy of these classes using the present invention. Note that the information contained in this object-hierarchy (instantiations of these classes) is the same irrespective of the language in which the RTL code is to be written.

FIG. 4 is a more detailed illustration of the module class 300 according to the preferred embodiment of the present invention. The module class 300 includes the following functions: an add package declaration module 404, an add port module 406, an add block module 408, an add comments module 410, a create signal module 412, a get constant module 414, a get module name module 416, a get architecture name module 418, a get port module 420, a get signal module 422, a write VHDL port declaration module 424, a write Verilog module 426, and a write VHDL module 428. The operation of these modules would be apparent to persons skilled in the art.

The module class 300 includes data members such as: module name, architecture name (for VHDL), a list of package declarations (if any), a list of port objects 308, a list of signal objects 310 and a list of block objects 302. The port objects 308 contain all the information required to declare the port interfaces of this module. The signal list in conjunction with the port list is used to identify the signals that need to be declared for this module. For VHDL, component declarations are automatically written out if any component instantiation blocks are present. The architecture name is used to write out the header of the architecture body in VHDL. The code for each of the block objects is written from within the block object (block objects are discussed below) and they together form the main body of code for this module. Separate "write" functions are provided for Verilog and VHDL, to implement the appropriate language syntax and also to take care of subtle variations. For example, package declarations are required for VHDL and is implemented from within the "WriteVHDL" function whereas the "WriteVerilog" function does not use the list of package declarations.

FIG. 5 is a more detailed illustration of the block class 302 according to the preferred embodiment of the present invention. The block class 302 includes: a get label module 504, a get module reference 506, a write Verilog body module 508, a write VHDL declarations module 510, and a write VHDL body module 512.

The block class 302 is an abstract base class from which different types of blocks (concurrent processes) will be derived, for example,—an assignment class 318 for signal assignments, process block class 320 for process/always blocks, a component instantiation class 322 for component instantiations and an IF block class 324 for conditional signal assignments. The "write" functions are implemented as "virtual" functions thereby allowing each derived class to have its own "write" function implementation.

FIG. 6 is a more detailed illustration of the statement class 304 according to the preferred embodiment of the present invention. The statement class 304 includes a write Verilog body module 608, and a write VHDL body module 610. The statement class 304 is an abstract base class from which the different types of statements will be derived, such as an assignment class 318 for signal assignments, an IF statement class 326 for 'if-then-else' constructs and a case statement class 328 for case statements. These are the statements that are supported by synthesis. The assignment class 318 is derived from both the block class 302 and the statement class 204 thereby allowing it to be identified in both categories. This is an example of a multiple inheritance. The "write" functions are implemented as "virtual" functions thereby allowing each derived class to have its own "write" function implementation.

FIG. 7 is a more detailed illustration of the expression class 306 according to the preferred embodiment of the present invention. The expression class 306 includes a get OPN module 712, a check expression module 714, a write Verilog expression module 716, and a write VHDL expression module 718. The expression class is an abstract base class that acts as a place holder for 'atomic or leaf' expression objects such as 'constants' and 'signals' and for intermediate expression objects constructed from these atomic expressions. The intermediate expression class 330 implements the intermediate expression objects. The "write" functions are implemented as "virtual" functions thereby allowing each derived class to have its own "write" function implementation.

FIG. 8 is a more detailed illustration of the port class 308 according to the preferred embodiment of the present invention. The port class 308 includes a get name module 804, a get module reference module 806, a get direction module 808, a get width module 810, a get order module 812, a write Verilog declaration module 814, and a write VHDL declaration module 816.

The data members of the port class 308 include: name, module reference, direction, width and order. For synthesis, port objects are restricted to be either of type single bit, width equal to one (std_logic in VHDL) or bit vector, width greater than one (std_logic_vector in VHDL). The syntax for port declarations are inferred from direction which is either input or output or in/out, and order which is either up or down, the order in which the range is to be declared.

FIG. 9 is a more detailed illustration of the signal class 310 according to the preferred embodiment of the present invention. The signal class 310 includes a check expression module 906, a get name module 908, a get module reference module 910, a get Verilog type module 912, a get VHDL type string module 914, a get left index module 916, a get right index module 918, a write Verilog expression 920, a write VHDL expression module 922, a write Verilog declaration module 924, and a write VHDL declaration module 926.

The data members of the signal class 310 include: name, module reference, Verilog type, left index and right index. Signal objects can either be of type 'reg' or 'wire' in Verilog and this is captured in the Verilog type data member. VHDL does not make such a distinction. Signal objects require two different "write" functions for both languages, one to write out signal declaration and the other to write out expression syntax (name).

FIG. 10 is a more detailed illustration of the constant class 312 according to the preferred embodiment of the present invention. The constant class 312 includes a get name module 1004, a get value module 1006, a get width module 1008, a get VHDL type module 1010, a get Verilog expression module 1012, a get VHDL expression module, a check expression module 1016, a write Verilog expression module 1018, a write Verilog declaration module 1020, a write VHDL expression module 1022, and a write VHDL declaration module.

The data members of the constant class include: name, value and width. Three different types of constants are supported single bit (width=1), bit vector (width>1) and integer (width=0). Constant objects may have a name associated with them. If named constants are used then they are declared separately by using, for example, a package class 314 which is described below.

FIG. 11 is a more detailed illustration of the package class 314 according to the preferred embodiment of the present invention. The package class 314 includes a create package module 1102, an add package declaration module 1106, an add constant module 1110, a get package name module 1112, a get library name module 1114, a get constant module 1116, a write VHDL declaration module 1118, a write Verilog module 1120, and a write VHDL module 1122.

The data members of the package class 314 include: package name, library name, a list of package declarations, a list of (named) constant objects and a list of function objects. This class is attuned to capture the syntax and semantics of 'package' construct in VHDL, however it is also used with Verilog to define the constants as macros. The list of function objects is intended to explicitly define, for VHDL, some of the arithmetic operators which are available as a language feature in Verilog but are not available in VHDL.

FIG. 12 is a more detailed illustration of the branch class 316 according to the preferred embodiment of the present invention. The branch class 316 includes an add statement module 1202, a get branch expression module 1204, a get statement list size module 1206, a write Verilog expression module 1208, a write Verilog body module 1210, a write VHDL expression module, and a write VHDL body module 1214. The branch class captures or represents branch execution, e.g., in an IF-THEN-ELSE statement.

FIG. 13 is a more detailed illustration of the assignment class 318 according to the preferred embodiment of the present invention. The assignment class 318 includes an add expression module 1302, a get expression module 1304, a get target signal module 1306, a get target signal name module 1308, a write Verilog statement module 1310, and a write VHDL statement name 1312.

The data members of the assignment class 318 include: a label, module reference, target signal and the expression that is to be assigned to the target signal. The grammar for expressions and the construction of the expression object is discussed below. This class is also derived from the statement class.

FIG. 14 is a more detailed illustration of the process block class 320 according to the preferred embodiment of the present invention. The process block class 320 includes an add sensitivity module 1402, an add statement module 1404, a write Verilog body module 1406, and a write VHDL body module 1408.

The data members of the process block class 320 include: a label, module reference, sensitivity list and a list of statement objects. The sensitivity list is a list of event structures that include a signal and an edge that can be either 'posedge' or 'negedge' or 'level', for example. A sensitivity list is used for both Verilog and VHDL. The body of a process/always block includes statements that are provided in the statement list. The code for each of the statement objects is written from within the statement object.

FIG. 15 is a more detailed illustration of the component instantiation class 322 according to the preferred embodiment of the present invention. The instantiation class 322 includes an add connection module 1502, a get self reference module 1504, a write Verilog body module 1506, a write VHDL declaration module 1508, and a write VHDL body module 1510.

The data members of the component instantiation class 322 include: a label, a module reference, a self reference (to the module being instantiated) and a list of connection structures. The name of the instantiated module is given by the label. Connection structures connect signals of this module (module reference) to ports of the module being instantiated (self reference). The component instantiation statements are written out with explicit port signal association.

FIG. 16 is a more detailed illustration of the IF block class 324 according to the preferred embodiment of the present invention. The IF block class 324 includes an add IF expression module 1602, an add left expression module 1604, an add right expression module 1606, a get target signal module 1608, a get IF expression module 1610, a get left expression module 1612, a get right expression module 1614, a write Verilog body module 1616, and a write VHDL body module 1618.

The data members of the IF block class 324 include: a label, module reference, a target signal, an if expression, a left expression and a right expression. The target signal is assigned the left expression if the "if expression" is true or is assigned the right expression if the "if expression" is not true. The syntax variations for this block between Verilog and VHDL is handled by the "write" functions. This class supports the following syntax in Verilog, for example:

$$Sig = (X == 1'b0)?Y:Z;$$

and the corresponding syntax in VHDL:

$$Sig <= Y \text{ WHEN } X = \text{``0''} \text{ ELSE } Z;$$

Additional syntax can also be supported by the present invention.

FIG. 17 is a more detailed illustration of the IF statement class 326 according to the preferred embodiment of the present invention. The IF statement class 326 includes an add branch module 1702, a write Verilog body module 1704, and a write VHDL body module 1706.

The data members of the IF statement class 326 include: a list of branch class objects where each branch class objects includes a branch expression (an expression object) and a list of statement objects. The 'if-then-else' construct is viewed as multi-branch construct wherein each branch has a branch expression and if that expression is true the corresponding list of statements is executed. Note that exactly one of the branch expressions will evaluate to be true. An example of a typical If statement in Verilog is as follows:

$$\text{if } (X == 1'b0)$$
$$A = P;$$
$$\text{else if } (Y == 1'b1)$$
$$A = Q;$$
$$\text{else}$$
$$A = R;$$

and the corresponding syntax in VHDL:

$$\text{IF } (X = {'O'}) \text{ THEN}$$
$$A <= P;$$
$$\text{ELSIF } (Y = {'1'}) \text{ THEN}$$
$$A < -Q;$$

$$\text{ELSE}$$
$$A <= R;$$
$$\text{END IF;}$$

FIG. 18 is a more detailed illustration of the case statement class 328 according to the preferred embodiment of the present invention. The case statement class 328 includes an add branch module 1802, a get case expression 1804, a write Verilog body 1806, and a write VHDL body 1808.

The data members of the case statement class 328 include: a case expression (an expression object) and a list of branch class objects. The case expression is typically a signal object and the branch expressions of the branch class objects correspond to the various possible values the case expression (signal) can take. These branch expressions are typically constant objects. For each branch a list of statement objects is required.

FIG. 19 is a more detailed illustration of the intermediate expression class 330 according to the preferred embodiment of the present invention. The intermediate expression class 330 includes a check expression module 1908, an add left expression module 1910, an add right expression module 1912, a get OPN module 1914, a get operand module 1916, a get Verilog operand module 1918, a get VHDL operand module 1920, a write Verilog expression module 1922, and a write VHDL expression module 1924.

The data members of the intermediate expression class 330 include: an operation (no opn or event or unary or binary), an operator type (boolean and logic operators such as 'not', 'and', 'or'; arithmetic operators such as '+', '*' etc., and event operators for signal events), a left expression and a right expression. An example of the permitted grammar is as follows:

Expn: (no opn) left_expression
1 (event or unary operator) right_expression
1 left expression (binary operator) right_expression.

This grammar allows for the construction of arbitrary expressions.

FIG. 20 is a more detailed illustration of the leaf expression class 332 according to the preferred embodiment of the present invention. The leaf expression class includes a get OPN module 2002. The leaf expression class 332 is an abstract class that acts as a place holder for signal class and constant class which are the two possible atomic or leaf level expression objects.

The above described classes of the present invention capture the synthesizable constructs of both Verilog and VHDL. These classes have been implemented and compiled as a library archive. The user (software tool) can link to this library archive and instantiate a hierarchy of objects corresponding to the functionality of the module to be generated during the second portion of the present invention, i.e., the use of the SynRTL library to generate an HDL independent design representation. The system and method of this second portion is set forth below.

FIG. 21 illustrates a computer system 2100 in which system level RTL hardware designs are generated using the SynRTL library 216. The computer system 2100 includes a processor 2102, I/O device 2104, and memory 2106, 2108. In the preferred embodiment, non-volatile memory 2106 and volatile memory 2108 are used. An I/O interface 2108 and the executable object code 118, representing an HDL independent RTL hardware design software tool, are stored within the volatile memory. The executable object code (with the SynRTL library compiled therein) is executed within the processor to produce an RTL design representation 2112. This RTL design representation 2112 may be a Verilog or VHDL HDL code or any other type of representation of RTL constructs.

FIG. 22 is a more detailed illustration of the computer system 2100 in which System level RTL Hardware designs are generated using the SynRTL library 216. In the preferred embodiment the processor 2102 is a microprocessor of a UNIX workstation 2202, and I/O device 2104 is the monitor, keyboard, and mouse (collectively 2202) of a UNIX workstation 2200. The non-volatile memory 2106 is a hard disk storage device 2204. In the preferred embodiment the microprocessor of workstation 2200 does not directly communicate with the hard disk storage 2204. However, in alternative embodiments, the hard disk storage 2204 is coupled directly to the microprocessor. The I/O interface 2110 is a graphical user interface (GUI) 2208, such as X-windows, from the Massachusetts Institute of Technology (MIT). The preferred embodiment generates VHDL and/or Verilog RTL code 2212 that is stored in UNIX files.

FIG. 23 is a detailed illustration of the preferred embodiment of an HDL independent system level RTL hardware design software tool 118 of the present invention. The tool resides in volatile memory 2206 along with GUI 2208, and interfaces with the monitor, keyboard, and mouse (collectively 2202) of a UNIX workstation. The preferred embodiment of the software tool 118 includes an HDL independent system level RTL design receiver 2300, which produces a system level RTL design representation 2308 based on the input from a hardware designer through the I/O device 2202. The system level RTL design representation 2308 is then translated into HDL independent RTL constructs 2310 by the system level to RTL code translator 2302. In the preferred embodiment, the HDL independent RTL constructs 2310 are then transformed into either Verilog or VHDL code 2312 by the HDL code generator 2304.

FIG. 24 is a flow diagram illustrating the preferred method the of the code execution part of the present invention. A user defines a system level RTL hardware design 2400. A system level RTL hardware design is a behavioral representation of a system which is independent of the particular target technology. Often, system level RTL hardware design includes connecting various predefined hardware modules in order to achieve some behavior. A hardware module is a representation of some specific functionality. An example of a hardware module is an up-down counter.

After a system level hardware design is defined, 2400, the present invention generates 2402 a register transfer level representation of the system from the system level hardware design. A register transfer level representation describes modules in terms of signals which are generated and propagated through combinational modules from one set of registers to another set of registers. The current invention generates a register transfer level representation that is independent of any HDL, and that includes only synthesizable constructs, as described above.

After the system level hardware design has been transformed into a register transfer level representation, it is often desirable to generate HDL code, 2406. HDL code can be "synthesized" into gate level netlists, the process of transforming HDL code into a form which can be used by a particular integrated circuit manufacturer to create an integrated circuit.

Another possibility is to generate a gate netlist directly from the intermediate register transfer level representation, 2408. In such a case, the ultimate design will never have been represented in a Hardware Description Language at all.

FIG. 25 is an object relation diagram using standard "booch" notation illustrating the hierarchy of objects in the SynRTL library. The relations between the various objects is shown in FIG. 25 in the conventional "booch" notation. By invoking the "write" function of the module object the entire body of code for that module is written out. The "write" functions of the various objects in this hierarchy are recursively invoked when appropriate, making the method of the present invention a true object-oriented solution. FIG. 25 sets forth the description of how a user generates the HDL independent code. Given the above description the operation of the invention will be apparent to persons skilled in the art.

An example of the operation of the second portion of the present invention is set forth with respect to FIGS. 25–28. FIG. 26 is an illustration of an up-down counter described using synthesizable Verilog code. FIG. 27 is an illustration of an up-down counter described using synthesizable VHDL code. FIG. 28 is an illustration of the object hierarchy for an up-down counter using the SynRTL library 116 of the present invention.

As an example, the use of the present invention in describing an up-down counter is set forth. The method for generating an up-down counter, for example, is illustrated in general in FIG. 28. The RTL code for an up-down counter in synthesizable Verilog is shown in FIG. 26. The RTL code for the same module in VHDL is shown in FIG. 27. The RTL code shown in FIGS. 26 and 27 are used to illustrate how the HDL independent object hierarchy is created for an up-down counter according to the preferred embodiment of the present invention. A module class object 300 is instantiated with the module name "up_down_cnt". Then the port class 308 objects are instantiated for clk, rst, up dn and out ports and added to the module class object 300. Signal class objects 310 are instantiated for clk, rst, up_dn, out, int_out and out1 and are added to the module class object 300. Next, two process block class objects 320 and an assignment class object 318 are instantiated. These are added to the block list 302 of the module class object 300. The first block object corresponds to the up-dn combinational process, the second block object corresponds. to the sequential process and the last block object corresponds to the concurrent signal assignment block. The first process block class object is filled with an IF statement class 326 object with three branches and the second one is filled with an IF statement class 326 object with two branches. The decomposition of the assignment class 318 at the block level and statement level is not shown. The decomposition of expression class objects 306 are also not shown as the use of these objects will be apparent to those skilled in the art.

Any software tool which needs to generate an up down counter can use the SynRTL framework of the present invention and create the object-hierarchy illustrated in FIG. 28. This is accomplished by linking to the SynRTL library archive and using the member functions of the classes. Verilog code as shown in FIG. 26, or VHDL code as shown in FIG. 27 can then be generated by invoking the member "write" functions of the module class 300.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. A method for processing a system level hardware design representation using a digital computer, the method comprising the steps of:

receiving a system level hardware design representation; and transforming said system level hardware design representation into a synthesizable HDL-independent RTL representation of object-oriented components.

2. The method of claim 1, further comprising the step of:

transforming said object-oriented components into a HDL code representation.

3. The method of claim 2, further comprising the step of:

outputting said HDL representation to a digital computer file.

4. The method of claim 1, further comprising the step of:

transforming said object-oriented components into a Verilog code representation.

5. The method of claim 4, further comprising the step of:

outputting said Verilog code representation to a digital computer file.

6. The method of claim 1, further comprising the step of:

transforming said object-oriented components into a VHDL code representation.

7. The method of claim 6, further comprising the step of:

outputting said VHDL code representation to a digital computer file.

8. A system for generating a computer program using a digital computer, said computer program capable of transforming a system level hardware design representation into a synthesizable HDL-independent RTL representation, comprising:

a processor;

a storage device coupled to said processor;

a user interface, coupled to said storage device or processor, for allowing a user to specify and initiate the compilation of a computer program;

an objected-oriented language compiler/linker, resident in said storage device, for compiling and linking computer program source code files and computer programming library files;

computer programming library files, resident in said storage device, for generating object-oriented programming objects;

an object-oriented computer programming library file, resident in said storage device, for generating synthesizable HDL-independent RTL hardware design objects; and computer program source code files, resident in said storage device, said files being compilable into a computer program for receiving system level hardware design user input and translating said input into a RTL representation.

9. A system for transforming a system level hardware design into a RTL hardware design using a digital computer comprising:

a processor;

storage means coupled to said processor;

user interfacing means coupled to said processor, disposed to receive signals from the system user representing a system level hardware design;

system level hardware design receiving means, disposed to receive signals from said user interfacing means, for receiving signals indicative of the system level hardware design; and system level hardware design transforming means, coupled to said system level hardware design representation receiving means, for transforming signals indicative of the system level hardware design into a synthesizable HDL-independent RTL object-oriented representation.

10. The system of claim 9, further comprising:

HDL code generating means, coupled to said system level hardware design transforming means, for generating a HDL code representation of a synthesizable HDL-independent RTL object-oriented representation.

11. The system of claim 10, further comprising:

RTL code outputting means, coupled to said HDL code generating means, for generating a digital computer file consisting of a HDL code representation.

12. The system of claim 10, further comprising:

RTL code outputting means, coupled to said HDL code generating means, for generating a digital computer file consisting of a Verilog code representation.

13. The system of claim 10, further comprising:

RTL code outputting means, coupled to said HDL code generating means, for generating a digital computer file consisting of a VHDL code representation.

14. The system of claim 9, further comprising:

HDL code generation means, coupled to said system level hardware design transforming means, for generating a Verilog code representation of the system level hardware design.

15. The system of claim 9, further comprising:

HDL code generation means, coupled to said system level hardware design transforming means, for generating a VHDL code representation of the system level hardware design.

* * * * *